(12) United States Patent
Hodota et al.

(10) Patent No.: US 8,637,888 B2
(45) Date of Patent: Jan. 28, 2014

(54) SEMICONDUCTOR LIGHT EMITTING ELEMENT, LIGHT EMITTING DEVICE USING SEMICONDUCTOR LIGHT EMITTING ELEMENT, AND ELECTRONIC APPARATUS

(75) Inventors: Takashi Hodota, Ichihara (JP); Takehiko Okabe, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 13/514,809

(22) PCT Filed: Dec. 9, 2010

(86) PCT No.: PCT/JP2010/072088
§ 371 (c)(1),
(2), (4) Date: Jun. 8, 2012

(87) PCT Pub. No.: WO2011/071100
PCT Pub. Date: Jun. 16, 2011

(65) Prior Publication Data
US 2012/0235204 A1    Sep. 20, 2012

(30) Foreign Application Priority Data

Dec. 11, 2009    (JP) .................................. 2009-282183

(51) Int. Cl.
*H01L 33/60*    (2010.01)
(52) U.S. Cl.
USPC ................. 257/98; 257/13; 257/79; 257/103; 257/E33.068; 257/E25.028
(58) Field of Classification Search
USPC ......... 257/13, 79–103, 918, E51.018–51.022, 257/E33.001–E33.077, E25.028, E25.032
See application file for complete search history.

(56) References Cited

U.S. PATENT DOCUMENTS

2006/0231854 A1    10/2006    Chae et al.
2008/0048172 A1    2/2008    Muraki et al.
(Continued)

FOREIGN PATENT DOCUMENTS

| JP | 6-296041 A | 10/1994 |
|---|---|---|
| JP | 2005-244207 A | 9/2005 |
| JP | 2006-120913 A | 5/2006 |
| JP | 2006-303430 A | 11/2006 |
| JP | 2007-214276 A | 8/2007 |

(Continued)

OTHER PUBLICATIONS

International Search Report for PCT/JP2010/072088 dated Jan. 18, 2011.

*Primary Examiner* — Mamadou Diallo
(74) *Attorney, Agent, or Firm* — Sughrue Mion, PLLC

(57) ABSTRACT

Disclosed is a semiconductor light emitting element (1), which includes: an n-type semiconductor layer (140); a light emitting layer (150), which is laminated on one surface of the n-type semiconductor layer (140) such that a part of the surface is exposed, and which emits light when a current is carried therein; a p-type semiconductor layer (160) laminated on the light emitting layer (150); a multilayer reflection film (180), which is configured by alternately laminating low refractive index layers (180a) and high refractive index layers (180b) that have a refractive index higher than that of the low refractive index layers (180a) and also have transparency with respect to light emitted from the light emitting layer (150), and which is laminated on the exposed portion of the n-type semiconductor layer (140), the exposed portion being on one side of the n-type semiconductor layer; an n-conductor portion (400), which is formed by penetrating the multilayer reflection film (180), and which has one end thereof connected to the exposed portion of the n-type semiconductor layer (140); and an n-electrode (310), which is laminated on the multilayer reflection film (180), and which has the other end of the n-conductor portion (400) connected thereto. Thus, light extraction efficiency is improved in the semiconductor light emitting element mounted by flip-chip bonding.

10 Claims, 10 Drawing Sheets

(56) References Cited

U.S. PATENT DOCUMENTS

| | | | |
|---|---|---|---|
| 2009/0085052 A1* | 4/2009 | Ko et al. | 257/98 |
| 2010/0163895 A1 | 7/2010 | Horie | |
| 2010/0163901 A1 | 7/2010 | Fudeta | |
| 2011/0018022 A1 | 1/2011 | Okabe et al. | |

FOREIGN PATENT DOCUMENTS

| | | |
|---|---|---|
| JP | 2008-182050 A | 8/2008 |
| JP | 2009-88299 A | 4/2009 |
| JP | 2010-171382 A | 8/2010 |
| WO | 2009-113659 A1 | 9/2009 |

* cited by examiner

SEMICONDUCTOR LIGHT EMITTING ELEMENT, LIGHT EMITTING DEVICE USING SEMICONDUCTOR LIGHT EMITTING ELEMENT, AND ELECTRONIC APPARATUS

TECHNICAL FIELD

The present invention relates to a semiconductor light emitting element, a light emitting device using the semiconductor light emitting element, and an electronic apparatus.

BACKGROUND ART

A semiconductor light emitting element using a group III nitride semiconductor such as GaN is usually configured by forming a group III nitride semiconductor layer including a light emitting layer on a substrate of, for example, sapphire. As such semiconductor light emitting elements, there are those which emit light outputted from the light emitting layer to outside through the substrate by mounting the semiconductor light emitting element on a wiring board by flip-chip bonding.

As a conventional technique described in a gazette, there is a known technique for reflecting light, which has been outputted from a light emitting layer in an opposite direction of a substrate, toward the substrate by forming a reflection layer of a metal composed of silver or the like on a surface of a group III nitride semiconductor layer, which surface is opposite to a contact surface with the substrate (refer to Patent Literature 1).

Moreover, as another conventional technique described in a gazette, there is a known technique in which a multilayer reflection film composed of a dielectric material is formed on a surface side of a group III nitride semiconductor layer, which is opposite to a contact surface thereof with a substrate, to reflect light toward the substrate side, the light having been outputted from a light emitting layer toward an opposite side of the substrate (refer to Patent Literature 2).

CITATION LIST

Patent Literature

Patent Document 1: Japanese Patent Application Laid-Open Publication No. 2006-303430
Patent Document 2: Japanese Patent Application Laid-open Publication No. 2006-120913

SUMMARY OF INVENTION

Technical Problem

However, light is outputted in directions other than the directions toward the substrate side and the side opposite to the substrate from the light emitting layer, and consideration has not been given to extraction of such light.

An object of the present invention is to improve light extraction efficiency in a semiconductor light emitting element mounted by flip-chip bonding.

Solution to Problem

In order to attain the object, in the present invention, there is provided a semiconductor light emitting element including: a first semiconductor layer composed of a group III nitride semiconductor having a first conduction type; a light emitting layer that is laminated on one surface of the first semiconductor layer so as to expose a part of the one surface and emits light by current flow; a second semiconductor layer composed of a group III nitride semiconductor having a second conduction type, which is different from the first conduction type, and laminated on the light emitting layer; a first multilayer reflection film configured by alternately laminating first refractive index layers each having a first refractive index and transparency to light emitted from the light emitting layer and second refractive index layers each having a second refractive index, which is higher than the first refractive index, and transparency to light emitted from the light emitting layer, the first multilayer reflection film being laminated on the part of the one surface of the first semiconductor layer that has been exposed; a first conductor portion that is formed to penetrate the first multilayer reflection film, and one end thereof is connected to the exposed part of the first semiconductor layer; and a first electrode which is laminated on the first multilayer reflection film, and to which the other end of the first conductor portion is connected.

Moreover, the semiconductor light emitting element further includes: a transparent conductive layer that is composed of a metal oxide having transparency to light emitted from the light emitting layer and conductivity, and is laminated on the second semiconductor layer; a second multilayer reflection film configured by alternately laminating first refractive index layers each having a first refractive index and transparency to light emitted from the light emitting layer and second refractive index layers each having a second refractive index, which is higher than the first refractive index, and transparency to light emitted from the light emitting layer, the second multilayer reflection film being laminated on the transparent conductive layer; a second conductor portion that is formed to penetrate the second multilayer reflection film, and one end thereof is connected to the transparent conductive layer; and a second electrode which is laminated on the second multilayer reflection film, and to which the other end of the second conductor portion is connected.

Further, the second conductor portion has plural connective conductors, one end of each of which is connected to the transparent conductive layer and the other end of each of which is connected to the second electrode. Moreover, the plural connective conductors constituting the second conductor portion are formed so that a distance between the nearest neighbors out of the plural connective conductors becomes shorter as a distance from a joint portion of the first conductor portion and the first semiconductor layer becomes longer. Moreover, the plural connective conductors constituting the second conductor portion are formed so that a cross-sectional area thereof is increased as a distance from a joint portion of the first conductor portion and the first semiconductor layer becomes longer.

Further, the first electrode includes a first reflection layer having a reflecting property to light emitted from the light emitting layer and the second electrode includes a second reflection layer having a reflecting property to light emitted from the light emitting layer.

Still further, the second conductor portion and the second electrode are formed with plural layers continuing in a surface direction. Moreover, the first multilayer reflection film and the second multilayer reflection film are configured as one piece continuing in a surface direction.

Further, the first electrode and the second electrode have a first opening portion and a second opening portion used for electrical connection with outside, and further have a first bump electrode and a second bump electrode used for electrical connection with outside at the first opening portion and the second opening portion, and each of the first bump electrode and the second bump electrode includes a connective electrode containing Sn for connecting to outside on a tip end portion thereof.

Further, from another standpoint, in the present invention, there is provided a light emitting device including: a base portion on which a first wiring and a second wiring are formed; and a semiconductor light emitting element mounted on the base portion by flip-chip bonding, wherein the semiconductor light emitting element includes: a first semiconductor layer composed of a group III nitride semiconductor having a first conduction type; a light emitting layer that is laminated on one surface of the first semiconductor layer so as to expose a part of the one surface and emits light by current flow; a second semiconductor layer composed of a group III nitride semiconductor having a second conduction type, which is different from the first conduction type, and laminated on the light emitting layer; a first multilayer reflection film configured by alternately laminating first refractive index layers each having a first refractive index and transparency to light emitted from the light emitting layer and second refractive index layers each having a second refractive index, which is higher than the first refractive index, and transparency to light emitted from the light emitting layer, the first multilayer reflection film being laminated on the part of the one surface of the first semiconductor layer that has been exposed; a first conductor portion that is formed to penetrate the first multilayer reflection film, and one end thereof is connected to the exposed part of the first semiconductor layer; and a first electrode which is laminated on the first multilayer reflection film, and to which the other end of the first conductor portion is connected.

Further, an electronic apparatus to which the present invention is applied is equipped with the above-described semiconductor light emitting element.

Advantageous Effects of Invention

According to the present invention, it is possible to improve the light extraction efficiency in the semiconductor light emitting element mounted by flip-chip bonding.

DESCRIPTION OF EMBODIMENTS

Exemplary embodiments of the present invention will be described in detail below with reference to the accompanying drawings.

Figure 1:
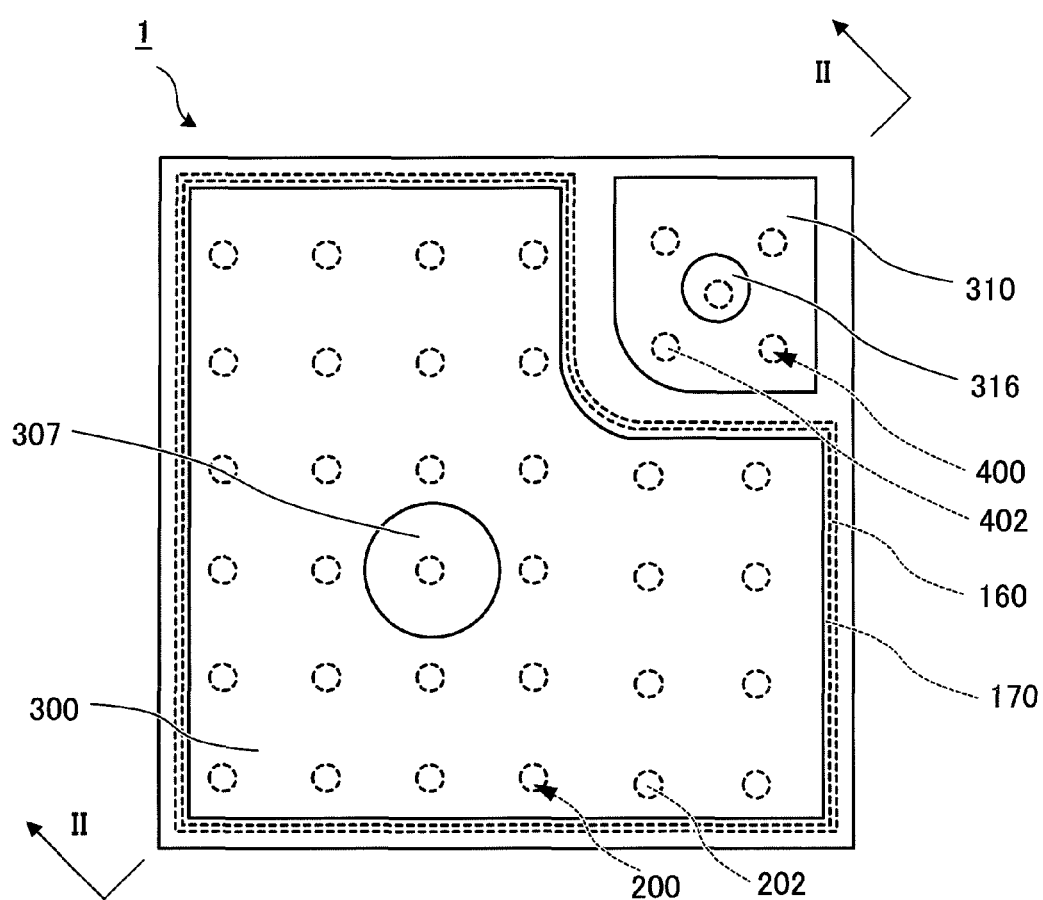
FIG. 1 is an example of a schematic plan view of a semiconductor light emitting element.
Figure 2:
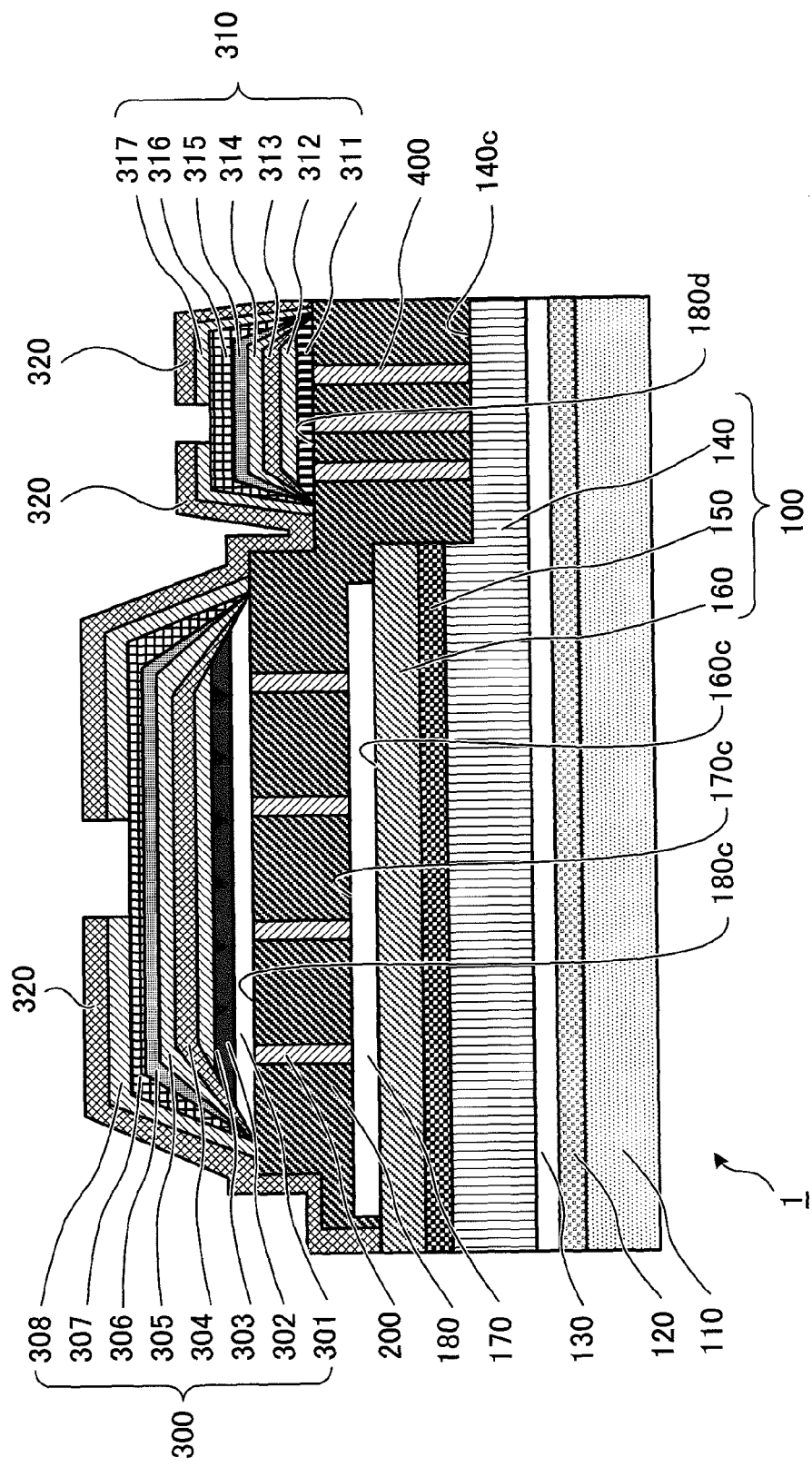
FIG. 2 is a cross-sectional view taken along II-II in FIG. 1.

FIG. 1 shows a schematic plan view of a semiconductor light emitting element (light emitting diode) 1 to which the exemplary embodiment is applied, and FIG. 2 shows a cross-sectional view of the semiconductor light emitting element 1 shown in FIG. 1 taken along II-II. It should be noted that, in FIG. 1, a top view of the semiconductor light emitting element 1 is shown with a passivation layer 320, which will be described later, being removed for the sake of convenience.

The semiconductor light emitting element 1 shown in FIGS. 1 and 2 includes: a substrate 110; an intermediate layer 120 laminated on the substrate 110; and a base layer 130 laminated on the intermediate layer 120. Further, the semiconductor light emitting element 1 includes: an n-type semiconductor layer 140 as an example of a first semiconductor layer laminated on the base layer 130; a light emitting layer 150 laminated on the n-type semiconductor layer 140; and a p-type semiconductor layer 160 as an example of a second semiconductor layer laminated on the light emitting layer 150. It should be noted that, in the following description, these n-type semiconductor layer 140, light emitting layer 150 and p-type semiconductor layer 160 are correctively referred to as a laminated semiconductor layer 100 as necessary.

Moreover, in the semiconductor light emitting element 1, a top surface 140c of the n-type semiconductor layer 140 exposed by cutting out a part of the laminated p-type semiconductor layer 160, the light emitting layer 150 and the n-type semiconductor layer 140 is formed.

Further, a transparent conductive layer 170 having transparency to light emitted from the light emitting layer 150 is laminated on the p-type semiconductor layer 160.

The semiconductor light emitting element 1 also includes a multilayer reflection film 180 in which plural through holes are formed. The multilayer reflection film 180 is configured with a material having insulating properties and transparency to the light outputted from the light emitting layer 150; however, since the multilayer reflection film 180 has a multilayer structure described later, the multilayer reflection film 180 has a function to reflect the light outputted from the light emitting layer 150. The multilayer reflection film 180 is formed by being laminated on the transparent conductive layer 170, the p-type semiconductor layer 160 on which the transparent conductive layer 170 is not laminated, and the n-type semiconductor layer 140 on which the light emitting layer 150 is not laminated. In addition, the multilayer reflection film 180 covers side surfaces of the light emitting layer 150 and the p-type semiconductor layer 160, namely, a portion corresponding to a wall portion of a step formed by the p-type semiconductor layer 160 and the n-type semiconductor layer 140, and further covers a side surface of the transparent conductive layer 170. Some of the plural through holes provided in the multilayer reflection film 180 are formed on an upper portion of the transparent conductive layer 170 in a direction vertical to the surface of the transparent conductive layer 170, and the through holes are substantially arranged in a matrix state. Further, some of the remaining plural through holes are formed on an upper portion of the top surface 140c of the n-type semiconductor layer 140 in a direction vertical to the top surface 140c, and the through holes are substantially arranged in a matrix state.

Moreover, the semiconductor light emitting element 1 includes a p-conductor portion 200, as an example of a second conductor portion, which is formed by penetrating the plural through holes provided on the upper portion of the transparent conductive layer 170 among the plural through holes provided in the multilayer reflection film 180. The p-conductor portion 200 is configured with p-connective conductors 202 of the number same as the number of through holes provided on the upper portion of the transparent conductive layer 170, and the p-connective conductors 202 are substantially arranged in a matrix state on the transparent conductive layer 170.

Further, the semiconductor light emitting element 1 includes a p-electrode 300 as an example of a second electrode laminated on the multilayer reflection film 180 at a position facing the transparent conductive layer 170 with the multilayer reflection film 180 interposed therebetween. One end of each of the plural p-connective conductors 202 constituting the p-conductor portion 200 is connected to the transparent conductive layer 170, and the other end is connected to the p-electrode 300.

Moreover, the semiconductor light emitting element 1 includes an n-conductor portion 400 formed by penetrating the plural through holes provided on the upper portion of the top surface 140c, as an example of an exposed portion, among the plural through holes provided in the multilayer reflection film 180. The n-conductor portion 400 is configured with n-connective conductors 402 of the number same as the number of through holes provided on the upper portion of the top surface 140c, and the n-connective conductors 402 are substantially arranged in a matrix state on the top surface 140c.

Further, the semiconductor light emitting element 1 includes an n-electrode 310 as an example of a first electrode laminated on the multilayer reflection film 180 at a position facing the top surface 140c with the multilayer reflection film 180 interposed therebetween. One end of each of the plural n-connective conductors 402 constituting the n-conductor portion 400 is connected to the top surface 140c, and the other end is connected to the n-electrode 310.

Still further, the semiconductor light emitting element 1 includes a passivation layer 320. The passivation layer 320 is laminated on the n-electrode 310, the p-electrode 300, the multilayer reflection film 180 and the laminated semiconductor layer 100 on which the multilayer reflection film 180 is not laminated.

In this way, the semiconductor light emitting element 1 of the exemplary embodiment has a configuration in which the p-electrode 300 and the n-electrode 310 are formed on one surface on an opposite side of the substrate 110.

In this semiconductor light emitting element 1, the light emitting layer 150 is configured to emit light by assuming that the p-electrode 300 is a positive electrode and the n-electrode 310 is a negative electrode, and by current flow via both of them through the laminated semiconductor layer 100 (more specifically, the p-type semiconductor layer 160, the light emitting layer 150 and the n-type semiconductor layer 140).

Hereinafter, each configuration of the semiconductor light emitting element 1 will be described.

<Substrate>

As the substrate 110, there is no particular limitation on any substrate as long as group III nitride semiconductor crystals are epitaxially grown on a surface thereof, and accordingly, various kinds of substrates can be selected and used. It should be noted that the substrate 110 is not an essential configuration in the present invention.

As will be described later, the semiconductor light emitting element 1 of the exemplary embodiment is mounted by flip-chip bonding so that the light is extracted from the substrate 110 side. Accordingly, it is preferable to have optical transparency to the light emitted from the light emitting layer 150 for increasing light extraction efficiency, and in particular, it is preferable to use sapphire whose C-plane is a principal surface as the substrate 110 for increasing light extraction efficiency. In the case where sapphire is used as the substrate 110, the intermediate layer 120 (buffer layer) may be formed on the C-plane of sapphire.

<Intermediate layer>

The intermediate layer 120 is preferably composed of polycrystal $Al_xGa_{1-x}N$ ($0 \le x \le 1$), and more preferably, composed of single crystal $Al_xGa_{1-x}N$ ($0 \le x \le 1$), and for example, the intermediate layer 120 can be composed of polycrystal $Al_xGa_{1-x}N$ ($0 \le x \le 1$) to have a thickness of 10 nm to 500 nm. It should be noted that the intermediate layer 120 has a function of mediating the difference in lattice constant between the substrate 110 and the base layer 130 to facilitate the formation of a single crystal layer which is c-axis oriented on the (0001) surface (c-face) of the substrate 110. Consequently, if a single crystal base layer 130 is laminated on the intermediate layer 120, the base layer 130 having more excellent crystallinity can be laminated. It should be noted that the intermediate layer 120 is not an essential configuration in the present invention.

<Base Layer>

As the base layer 130, $Al_xGa_yIn_zN$ ($0 \le x \le 1$, $0 \le y \le 1$, $0 \le z \le 1$, $x+y+z=1$) can be used, but it is preferable to use $Al_xGa_{1-x}N$ ($0 \le x < 1$) because the base layer 130 with excellent crystallinity can be formed.

The thickness of the base layer 130 is preferably 0.1 μm or more, and the $Al_xGa_{1-x}N$ layer having excellent crystallinity is likely to be obtained with this layer thickness or more. In addition, the thickness of the base layer 130 is preferably 10 μm or less. It should be noted that the base layer 130 is not an essential configuration in the present invention.

<Laminated Semiconductor Layer>

The laminated semiconductor layer 100 configured to contain the group III nitride semiconductor is, as shown in FIG. 2, configured by laminating the n-type semiconductor layer 140, the light emitting layer 150 and the p-type semiconductor layer 160 on the substrate 110 in this order. Further, each of the n-type semiconductor layer 140, the light emitting layer 150 and the p-type semiconductor layer 160 may be configured by plural semiconductor layers. Still further, the laminated semiconductor layer 100 may include the base layer 130 and the intermediate layer 120.

Here, the n-type semiconductor layer 140 performs electrical conduction of a first conduction type in which an electron is a carrier, while the p-type semiconductor layer 160 performs electrical conduction of a second conduction type in which a hole is a carrier.

<N-Type Semiconductor Layer>

The n-type semiconductor layer 140 as an example of a first semiconductor layer having the first conduction type is preferably configured with an n-contact layer and an n-cladding layer. It should be noted that the n-contact layer can also serve as the n-cladding layer. Further, the above-described base layer 130 may be included in the n-type semiconductor layer 140.

The n-contact layer is a layer for providing the n-electrode 310. The n-contact layer is preferably configured with the $Al_xGa_{1-x}N$ layer ($0 \le x < 1$, more preferably $0 \le x \le 0.5$, and still more preferably $0 \le x \le 0.1$).

It is preferable to provide the n-cladding layer between the n-contact layer and the light emitting layer 150. The n-cladding layer performs injection of the carriers into the light emitting layer 150 and confinement of the carriers. It should be noted that, in this specification, AlGaN, GaN and GaInN are described with the compositional ratio of each element being omitted in some cases. The n-cladding layer can be formed of AlGaN, GaN, GaInN and so on. The hetero junction structure or the superlattice structure in which the layer is laminated plural times of these structures may also be used. When the n-cladding layer is formed of GaInN, the band gap thereof is preferably larger than that of GaInN of the light emitting layer 150.

It should be noted that, in the case where the n-cladding layer is a layer containing the superlattice structure, the layer may contain a structure in which an n-side first layer composed of the group III nitride semiconductor with a thickness of 100 angstroms or less and an n-side second layer having a different composition from the n-side first layer and composed of the group III nitride semiconductor with a thickness of 100 angstroms or less are laminated.

Further, the n-cladding layer may contain a structure in which the n-side first layers and the n-side second layers are alternately and repeatedly laminated, and the structure is preferably an alternating structure of GaInN and GaN or an alternating structure of GaInN having different compositions.

<Light Emitting Layer>

As the light emitting layer 150 laminated on the n-type semiconductor layer 140, a single quantum well structure or a multiple quantum well structure can be employed.

As a well layer having a quantum well structure, the group III nitride semiconductor layer composed of $Ga_{1-y}In_yN$ (0<y<0.4) is usually used. The thickness of the well layer may be the thickness by which quantum effects can be obtained, for example, 1 nm to 10 nm, and is preferably 2 nm to 6 nm in terms of light emission output.

Moreover, in the case of the light emitting layer 150 having the multiple quantum well structure, the above-described $Ga_{1-y}In_yN$ is employed as the well layer, and $Al_zGa_{1-z}N$ (0≤z<0.3) having a band gap energy larger than that of the well layer is employed as a barrier layer. The well layer and the barrier layer may be doped or not doped with impurities depending upon a design thereof.

<P-Type Semiconductor Layer>

The p-type semiconductor layer 160 as an example of a second semiconductor layer having the second conduction type. The p-type semiconductor layer 160 is usually configured with the p-cladding layer and the p-contact layer. Further, the p-contact layer can also serve as the p-cladding layer.

The p-cladding layer performs confinement of carriers within the light emitting layer 150 and injection of carriers. The p-cladding layer is not particularly limited as long as the band gap energy of the composition thereof is larger than that of the light emitting layer 150 and carriers can be confined within the light emitting layer 150, but is preferably composed of $Al_xGa_{1-x}N$ (0<x≤0.4).

It is preferable that the p-cladding layer is composed of such AlGaN in terms of confinement of carriers within the light emitting layer 150. The thickness of the p-cladding layer is not particularly limited, but preferably 1 nm to 400 nm, and more preferably 5 nm to 100 nm.

Further, the p-cladding layer may have a superlattice structure in which the layer is laminated plural times of these structures, and preferably has an alternating structure of AlGaN and AlGaN or an alternating structure of AlGaN and GaN.

The p-contact layer is a layer for providing the p-electrode 300. The p-contact layer is preferably composed of $Al_xGa_{1-x}N$ (0≤x≤0.4). It is preferable that Al composition is in the above-described range in terms of allowing to maintain excellent crystallinity and good ohmic contact with the transparent conductive layer 170.

The thickness of the p-contact layer is not particularly limited, but is preferably 10 nm to 500 nm, and more preferably 50 nm to 200 nm. It is preferable to provide the thickness of the p-contact layer in these ranges in terms of light emission output.

<Transparent Conductive Layer>

As shown in FIG. 2, the transparent conductive layer 170 is laminated on the p-type semiconductor layer 160. When viewed in a planar view as shown in FIG. 1, the transparent conductive layer 170 is formed to cover almost the entire top surface except for edge portions of the p-type semiconductor layer 160, part of which has been removed by means of etching or the like so as to form the n-electrode 310.

It is preferable that the transparent conductive layer 170 is capable of making an ohmic contact with the p-type semiconductor layer 160 and has a small contact resistance with the p-type semiconductor layer 160. Further, in the semiconductor light emitting element 1, since the light from the light emitting layer 150 is extracted to the substrate 110 side via the multilayer reflection film 180 and so on, it is preferable that the transparent conductive layer 170 has excellent transparency. Still further, for uniformly diffusing an electric current over the entire surface of the p-type semiconductor layer 160, it is preferable to use the transparent conductive layer 170 having excellent conductivity and narrow resistance distribution.

It should be noted that the thickness of the transparent conductive layer 170 can be selected from the range of 2 nm to 500 nm. Here, if the thickness of the transparent conductive layer 170 is less than 2 nm, there occur some cases where the ohmic contact with the p-type semiconductor layer 160 is hardly available; meanwhile, if the thickness of the transparent conductive layer 170 is more than 500 nm, there are some unfavorable cases in terms of optical transparency to light emitted from the light emitting layer 150 and reflected light from the multilayer reflection film 180 and so on.

As an example of the transparent conductive layer 170, a conductive oxide material having excellent optical transparency to light of a wavelength emitted from the light emitting layer 150 is used. Especially, part of oxides containing In is preferable in the point that both optical transparency and conductivity are excellent in comparison with other transparent conductive films. Examples of conductive oxides containing In include: IZO (indium zinc oxide ($In_2O_3$—ZnO)); ITO (indium tin oxide ($In_2O_3$—$SnO_2$)); IGO (indium gallium oxide ($In_2O_3$—$Ga_2O_3$)); and ICO (indium cerium oxide ($In_2O_3$—$CeO_2$)). It should be noted that impurities such as fluorine may be added to these materials. Further, oxides not containing In, for example, conductive materials such as carrier-doped $SnO_2$, $ZnO_2$, $TiO_2$ and so on may be used.

The transparent conductive layer 170 can be formed by providing these materials by any well-known method in this technical field. By applying thermal annealing after the transparent conductive layer 170 is formed, a transmittance factor of the transparent conductive layer 170 is increased, the sheet resistance is reduced, and the ohmic contact becomes available.

In the exemplary embodiment, as the transparent conductive layer 170, a crystallized structure may be used, and in particular, a transparent material containing an $In_2O_3$ crystal having a crystal structure of a hexagonal system or a bixbyite structure (for example, ITO, IZO or the like) can be preferably used.

Further, as a film used for the transparent conductive layer 170, it is preferable to use a composition showing the lowest specific resistance. For example, a ZnO concentration in IZO is preferably 1% by mass to 20% by mass, and more preferably in a range of 5% by mass to 15% by mass, and 10% by mass is especially preferred.

<Multilayer Reflection Film>

As shown in FIG. 2, the multilayer reflection film 180 is laminated to cover each of the transparent conductive layer 170, the p-type semiconductor layer 160 on which the transparent conductive layer 170 is not laminated, and the n-type semiconductor layer 140 on which the light emitting layer 150 is not laminated. In addition, the multilayer reflection film 180 covers not only the surface of surface direction of each layer, but also side surfaces of the light emitting layer 150 and the p-type semiconductor layer 160, namely, a portion corresponding to a wall portion of a step formed by the p-type semiconductor layer 160 and the n-type semiconductor layer 140, and further covers the side surface of the transparent conductive layer 170.

The multilayer reflection film 180 shown in FIG. 2 is a one-piece configuration continuing in the surface direction of the laminated semiconductor layer 100.

Here, the multilayer reflection film 180 may be two or more multilayer reflection films 180 divided in the surface direction of the laminated semiconductor layer 100. For example, a portion laminated on the transparent conductive layer 170 and the p-type semiconductor layer 160 on which the transparent conductive layer 170 is not laminated, as an example of a second multilayer reflection film, and a portion laminated on the n-type semiconductor layer 140 on which the light emitting layer 150 is not laminated, as an example of a first multilayer reflection film, are separately formed, and thereby two multilayer reflection films 180 may be provided. This means that the separate multilayer reflection films 180 are formed on the n-electrode 310 side and the p-electrode 300 side. It should be noted that the configuration in which the multilayer reflection film 180 is formed as one piece continuing in the surface direction as shown in FIG. 2 is preferred compared to the separately formed configuration because of capability of improving the light extraction efficiency.

Moreover, the multilayer reflection film 180 may have a configuration to be formed on only one of the n-electrode 310 side and the p-electrode 300 side.

Figure 3:
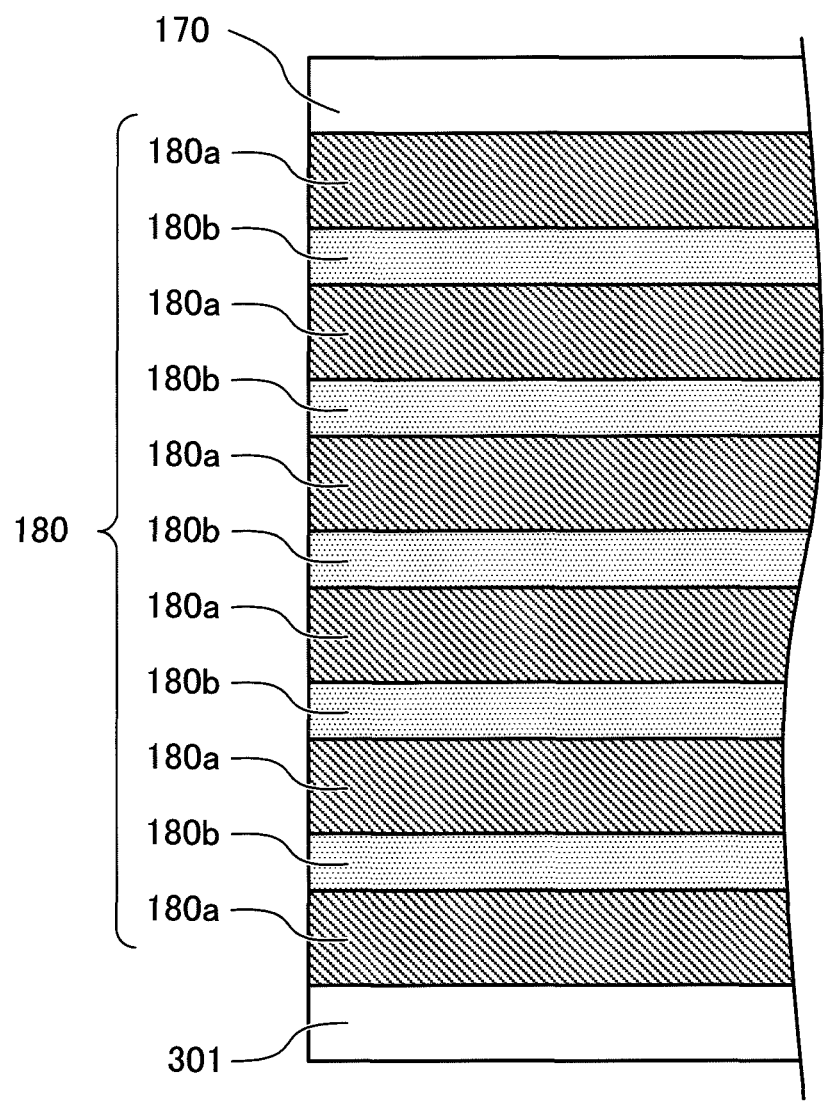
FIG. 3 is an example of a schematic cross-sectional view of a multilayer reflection film constituting the semiconductor light emitting element.

FIG. 3 shows an example of a schematic cross-sectional view of the multilayer reflection film 180.

The multilayer reflection film 180 is configured by alternately laminating low refractive index layers 180a as an example of a first refractive index layer and high refractive index layers 180b as an example of a second refractive index layer, being different in refractive indexes. Especially, the exemplary embodiment employs a configuration in which one high refractive index layer 180b is sandwiched by two low refractive index layers 180a, and in this specific example, five high refractive index layers 180b are sandwiched between six low refractive index layers 180a to provide eleven layers of laminated layer configuration in total. It should be noted that, of the multilayer reflection film 180, the uppermost layer exposed to outside may be configured with the low refractive index layer 180a or the high refractive index layer 180b.

As the low refractive index layer 180a and the high refractive index layer 180b, a material having high optical transparent properties to the light emitted from the light emitting layer 150 is used. Here, as the low refractive index layer 180a, for example, $SiO_2$ (silicon oxide) or $MgF_2$ (magnesium fluoride) can be used, and as the high refractive index layer 180b, $TiO_2$ (titanium oxide), $Ta_2O_5$ (tantalum oxide), $ZrO_2$ (zirconium oxide), $HfO_2$ (hafnium oxide) or $Nb_2O_5$ (niobium oxide) can be used. However, as long as a relationship of refractive index with the high refractive index layer 180b is satisfied, these $TiO_2$, $Ta_2O_5$, $ZrO_2$, $HfO_2$ or $Nb_2O_5$ may be used as the low refractive index layer 180a.

Here, in the exemplary embodiment, $SiO_2$ (silicon oxide) was used as the low refractive index layer 180a, and $TiO_2$ (titanium oxide) was used as the high refractive index layer 180b. These have high optical transparency to the light of the light emitting layer 150 with light emission wavelength λ (=400 nm to 450 nm). It should be noted that, in the case where the light emission wavelength λ of the light emitting layer 150 is still shorter, and light of the near-ultraviolet region is emitted, it is desirable of use $Ta_2O_5$ (tantalum oxide), $Nb_2O_5$ (niobium oxide), $ZrO_2$ (zirconium oxide), $HfO_2$ (hafnium oxide) or the like having optical band gap larger than that of $TiO_2$ (titanium oxide) as the high refractive index layer 180b instead of $TiO_2$ (titanium oxide) that absorbs the light of the near-ultraviolet region. However, even in the case where the light emitting layer 150 emits light in the ultraviolet region, $SiO_2$ (silicon oxide) can be used as the low refractive index layer 180a.

Further, when it is supposed that the light emission wavelength of the light emitting layer 150 is λ (nm), the refractive index of the low refractive index layer 180a to the light emission wavelength λ is $n_L$ and the refractive index of the high refractive index layer 180b to the light emission wavelength λ is $n_H$, thickness $d_L$ of each low refractive index layer 180a and thickness $d_H$ of each high refractive index layer 180b are set based on the expressions shown as follows.

[Expression 1]

$$d_L = \frac{\lambda}{4 \times n_L} \quad (1)$$

$$d_H = \frac{\lambda}{4 \times n_H} \quad (2)$$

Accordingly, as it is apparent from the above expressions (1) and (2), the thickness $d_L$ of the low refractive index layer 180a definitely becomes thicker than the thickness $d_H$ of the high refractive index layer 180b.

<Conductor Portion>

As the first conductor portion and the second conductor portion, p-conductor portion 200 and the n-conductor portion 400 are shown as an example in the exemplary embodiment. As shown in FIGS. 1 and 2, each of the p-conductor portion 200 and the n-conductor portion 400 is provided to penetrate the multilayer reflection film 180.

In addition, the p-conductor portion 200 is formed by p-connective conductors 202 that are plural connective conductor portions on the p-electrode 300 side. One end on the substrate 110 side of each of the p-connective conductors 202 is connected to a top surface 170c of the transparent conductive layer 170, and the other end thereof is connected to the p-electrode 300.

The n-conductor portion 400 is formed by n-connective conductors 402 that are plural connective conductor portions on the n-electrode 310 side. One end on the substrate 110 side of each of the n-connective conductors 402 is connected to the top surface 140c of the n-type semiconductor layer 140, and the other end thereof is connected to the n-electrode 310.

It should be noted that, for clarification, scale of the p-connective conductors 202 and the n-connective conductors 402 in FIG. 2 is changed, and the scale is extremely different from dimensions of the p-connective conductors 202 and the n-connective conductors 402 in the exemplary embodiment.

In the exemplary embodiment, regarding the p-connective conductors 202 and the n-connective conductors 402, the diameter thereof is preferably in the range of 10 μm to 50 μm, length (depth) thereof is preferably in the range of 300 nm to 5 μm, and for example, the p-connective conductors 202 and the n-connective conductors 402 have the diameter of 10 μm and the length (depth) of 500 nm.

The plural p-connective conductors 202 are, as shown in FIG. 1, formed in the entire p-electrode 300. The electric current passing through each of the p-connective conductors 202 is used for light emission of the light emitting layer 150.

In the exemplary embodiment, by providing the plural, not a single, p-connective conductors 202, the electric current is uniformly diffused over the entire surface of the p-type semiconductor layer 160 on the top surface 160c. This makes it possible to improve nonuniformity in light emission in the light emitting layer 150.

Moreover, the plural n-connective conductors 402 are, as shown in FIG. 1, distributed and formed in the entire n-electrode 310. By providing the plural n-connective conductors 402, an electric current in the state where nonuniformity is improved on the top surface 140c of the n-type semiconductor layer 140 is supplied. This makes it possible to emit light with improved nonuniformity in the light emitting layer 150.

The p-connective conductors 202 and the n-connective conductors 402 are formed by applying metal plating on the wall surfaces of the through holes formed by use of dry etching or the like. Alternatively, the p-connective conductors 202 and the n-connective conductors 402 may be formed by charging a metal, metal alloy or conductive metal oxide into the through holes in the multilayer reflection film 180. Examples of materials for metal plating or filler metal include Cu, AuNi, ITO or IZO. In addition, the p-connective conductors 202 may be formed at the same time with forming of a first conductive layer 301, which will be described later. Similarly, the n-connective conductors 402 may be formed at the same time with forming of a first metal layer 311.

<Electrode>

Next, configurations of the first and second electrodes will be described.

<First Electrode>

A configuration of the n-electrode 310, which is an example of the first electrode in the exemplary embodiment, will be described.

The n-electrode 310 includes: a first metal reflection layer 311, which is an example of a first reflection layer, laminated on the multilayer reflection film 180; a first diffusion barrier layer 312; a second diffusion barrier layer 313; a third diffusion barrier layer 314; a fourth diffusion barrier layer 315; a first bonding layer 316, the first diffusion barrier layer 312 to the first bonding layer 316 being upwardly laminated on the first metal reflection layer 311 in FIG. 2; and a first adhesive layer 317 laminated to cover the first bonding layer 316 except for an exposed portion of the first bonding layer 316. It is preferable to provide a metal reflection layer as at least one of the first metal reflection layer 311 to the first adhesive layer 317 because the light extraction efficiency can be improved, as will be described later. For example, the first metal reflection layer 311 is configured as the metal reflection layer composed of Al (aluminum). Moreover, similar to the second electrode described later, a transparent conductive layer composed of ITO, IZO or IGO can be used under the first metal reflection layer.

<Second Electrode>

A configuration of the p-electrode 300, which is an example of the second electrode in the exemplary embodiment, will be described.

The p-electrode 300 includes: a first conductive layer 301 laminated on the multilayer reflection film 180; a second metal reflection layer 302, which is an example of a second reflection layer; a first diffusion barrier layer 303; a second diffusion barrier layer 304; a third diffusion barrier layer 305; a fourth diffusion barrier layer 306 and a first bonding layer 307, the second metal reflection layer 302 to the first bonding layer 307 being upwardly laminated on the first conductive layer 301 in FIG. 2; and a first adhesive layer 308 laminated to cover the first bonding layer 307 except for an exposed portion of the first bonding layer 307. It is preferable to provide a metal reflection layer as at least one of the first conductive layer 301 to the first adhesive layer 308 because the light extraction efficiency can be improved, as will be described later. For example, the second metal reflection layer 302 is configured as the metal reflection layer composed of Ag (silver).

<Passivation Layer>

As shown in FIG. 2, the passivation layer 320 is laminated on the first adhesive layer 308, the first adhesive layer 317, the multilayer reflection film 180 and the p-type semiconductor layer 160 on which the transparent conductive layer 170 is not laminated. The passivation layer 320 is formed of $SiO_2$ (silicone oxide) or the like. It is possible to reduce a fear of entry of external air or water into the light emitting layer 150 in the semiconductor light emitting element 1, and thereby to prevent separation of the p-electrode 300 or the n-electrode 310 of the semiconductor light emitting element 1.

<Bump Electrode>

After a not-shown under bump metal layer (abbreviated and referred to as a UBM film) formed with an alloy layer composed of Ti or Ti and W and an Au layer is formed on the passivation layer 320, an opening portion of the n-electrode 310 and an opening portion of the p-electrode 300, a resist is applied.

Figure 4:
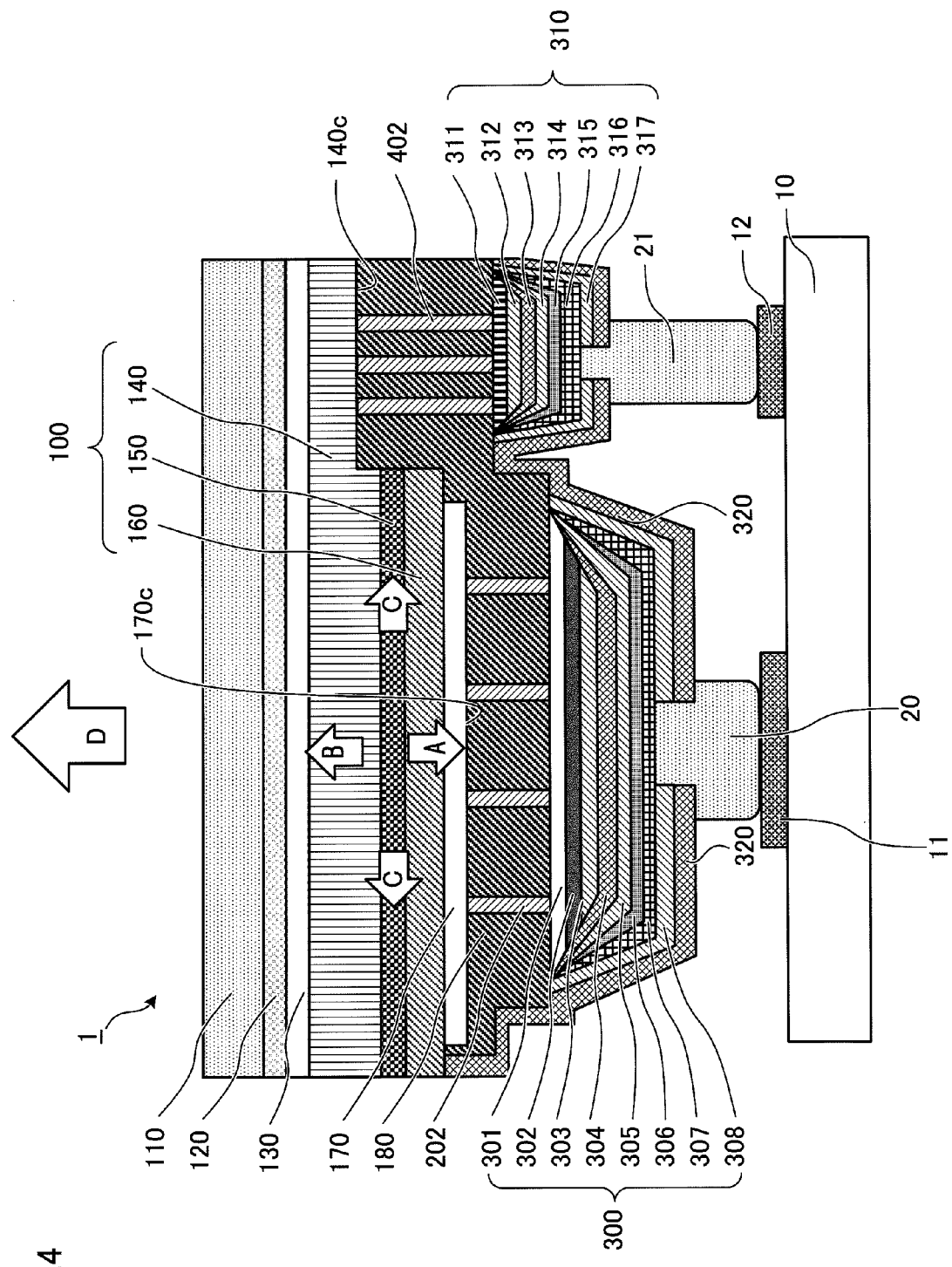
FIG. 4 is a diagram illustrating an example of a light emitting device in which the semiconductor light emitting element is mounted on a wiring board by flip-chip bonding.

Next, the resist on upper portions of the opening portions is removed, and as shown in FIG. 4, Au is deposited in a protruding state by a known plating method, thereby a first bump electrode 21 and a second bump electrode 20 (described later) are formed. The thickness of Au deposited at this time is desirably 2 μm to 25 μm, more desirably 5 μm to 20 μm, and still more desirably 10 μm to 15 μm. If the thickness of Au is less than 2 μm, there occur some cases in which solder containing Sn used for connection in mounting contacts the positive electrode or the negative electrode, and thereby leakage is caused. Further, in the case where the thickness of Au is more than 25 μm, a difficulty occurs in terms of production costs.

After forming the Au plating, a film of an AuSn alloy is formed by a plating method, an evaporation method or a sputtering method, and subsequently, the resist and the UBM film around the first bump electrode 21 and the second bump electrode 20 are removed by etching. Regarding an etchant, for example, for etching of Au, etching can be performed by use of a mixed solution of KI and $I_2$, and for etching of Ti or an alloy of Ti and W, etching can be performed by use of a mixed solution of sulfuric acid and hydrogen peroxide.

FIG. 4 is a diagram illustrating an example of a configuration of a light emitting device in which the semiconductor light emitting element 1 shown in FIG. 2 is mounted on a wiring board 10.

On one surface of the wiring board 10 as an example of a base portion, an anode 11 and a cathode 12 are formed. With respect to the wiring board 10 in a state where the semiconductor light emitting element 1 shown in FIG. 2 is turned upside down, the p-electrode 300 and the n-electrode 310 are electrically connected using solders and mechanically fastened to the anode 11 and the cathode 12, respectively. Such a method of connecting the semiconductor light emitting element 1 to the wiring board 10 is generally referred to as flip-chip bonding. In the flip-chip bonding, the substrate 110 of the semiconductor light emitting element 1 is placed at a farther position than the light emitting layer 150 as viewed from the wiring board 10.

Then a light emitting operation will be described by using the light emitting device shown in FIG. 4.

When an electric current from the anode 11 to the cathode 12 is fed through the semiconductor light emitting element 1 via the anode 11 and the cathode 12 of the wiring board 10, in the semiconductor light emitting element 1, an electric current from the p-electrode 300 to the n-electrode 310 is passed through the p-conductor portion 200, the transparent conductive layer 170, the p-type semiconductor layer 160, the light emitting layer 150, the n-type semiconductor layer 140 and the n-conductor portion 400. As a result, the light emitting layer 150 outputs light in all directions. In FIG. 4, light in the direction of arrow A proceeding toward the p-electrode 300, light in the direction of arrow B proceeding toward the substrate 110, and light in the direction of arrow C proceeding toward the lateral direction are exemplified.

It should be noted that, though the semiconductor light emitting element 1 provides the multilayer reflection film 180 having insulation properties between the p-electrode 300 or the n-electrode 310 and the laminated semiconductor layer 100, it becomes possible to pass an electric current necessary for light emission of the light emitting layer 150 by providing the p-conductor portion 200 and the n-conductor portion 400 so as to penetrate the multilayer reflection film 180. In addition, at this time, an electric current passes through the p-electrode 300 via the first bonding layer 307, the fourth diffusion barrier layer 306, the third diffusion barrier layer 305, the second diffusion barrier layer 304, the first diffusion barrier layer 303, the second metal reflection layer 302 and the first conductive layer 301, and an electric current in the state where the nonuniformity is suppressed on the top surface 160c is supplied to the p-type semiconductor layer 160.

First, of the light emitted from the light emitting layer 150, the light in the direction of arrow A proceeding toward the multilayer reflection film 180 reaches the multilayer reflection film 180 via the p-type semiconductor layer 160 and the transparent conductive layer 170, and is reflected by the multilayer reflection film 180. Then the light reflected by the multilayer reflection film 180 transmits through the transparent conductive layer 170, the p-type semiconductor layer 160, the light emitting layer 150, the n-type semiconductor layer 140, the base layer 130, the intermediate layer 120 and the substrate 110, and is mainly outputted in a direction of arrow D in FIG. 4, namely, to outside of the semiconductor light emitting element 1.

Next, of the light emitted from the light emitting layer 150, the light in the direction of arrow B proceeding toward the substrate 110 transmits through the n-type semiconductor layer 140, the base layer 130, the intermediate layer 120 and the substrate 110, and is mainly outputted in the direction of arrow D in FIG. 4, namely, to outside of the semiconductor light emitting element 1. However, part of the light directly proceeding toward the substrate 110 from the light emitting layer 150 returns to the inside of the semiconductor light emitting element 1. This is because, for example, due to the difference in the refractive indexes between the intermediate layer 120 and the substrate 110, the light proceeding from the light emitting layer 150 toward the substrate 110 is apt to be reflected at an interface between both of them.

The light returned to the inside of the semiconductor light emitting element 1 reaches the multilayer reflection film 180 via the n-type semiconductor layer 140, or via the n-type semiconductor layer 140, the p-type semiconductor layer 160 and the transparent conductive layer 170, and is reflected by the multilayer reflection film 180. Then, the light proceeds within the semiconductor light emitting element 1 to head for the substrate 110 again, and as a result, outputted in the direction of arrow D in FIG. 4, namely, to outside of the semiconductor light emitting element 1.

Of the light emitted from the light emitting layer 150, the light in the direction of arrow C proceeding toward the lateral direction reaches the multilayer reflection film 180 via the light emitting layer 150, for example, and is reflected by the multilayer reflection film 180. Then, the light reflected by the multilayer reflection film 180 proceeds within the semiconductor light emitting element 1, and is outputted in the direction of arrow D in FIG. 4, namely, to outside of the semiconductor light emitting element 1.

Here, the light returned to the semiconductor light emitting element 1 as described above proceeds not only toward the p-electrode 300, but also toward the direction of the n-electrode 310. In the exemplary embodiment, the multilayer reflection film 180 is also provided on the n-electrode 310 side, and thereby it becomes possible to reflect the light returned to the inside of the semiconductor light emitting element 1 on the n-electrode 310 side, too. As a result, the light extraction efficiency of the semiconductor light emitting element 1 is further improved.

Further, in the case where each of the p-electrode 300 and the n-electrode 310 includes the metal reflection layer as one layer thereof, even though the multilayer reflection film 180 is not able to reflect all of the lights, it becomes possible to emit light to outside of the semiconductor light emitting element 1 by reflecting light by the metal reflection layer. As a result, it becomes possible to still further improve the light extraction efficiency of the semiconductor light emitting element 1.

In this manner, in the exemplary embodiment, the semiconductor light emitting element 1 is provided with the multilayer reflection film 180 and causes the multilayer reflection film 180 to reflect light emitted to the opposite side of the substrate 110 from the light emitting layer 150, or light proceeded in the direction different from outside of the semiconductor light emitting element 1 due to being reflected by various interfaces. Moreover, in the case where each of the p-electrode 300 and the n-electrode 310 includes the metal reflection layer, the light is also reflected by the metal reflection layer. Then, by causing the reflected light to exit to outside of the semiconductor light emitting element 1, the light extraction efficiency of the semiconductor light emitting element 1 is improved.

Next, another exemplary embodiment will be described with reference to FIGS. 5 to 7.

Figure 5:
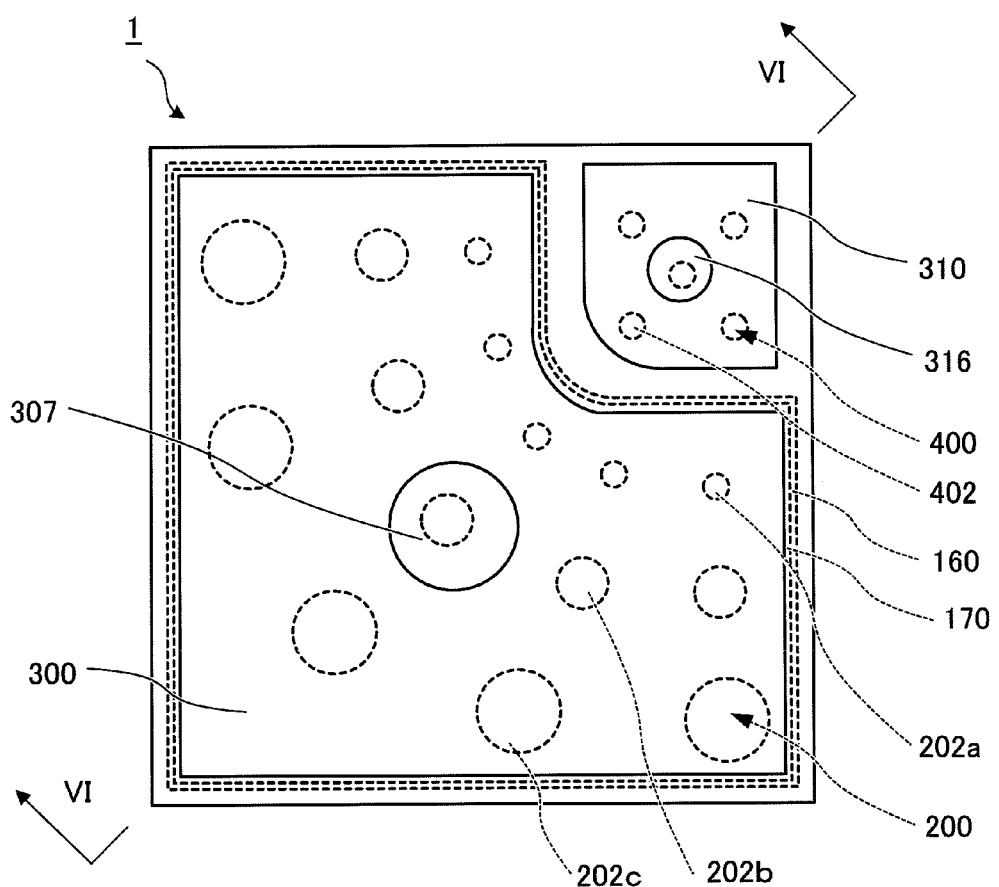
FIG. 5 is a schematic plan view of the semiconductor light emitting element according to another exemplary embodiment.
Figure 6:
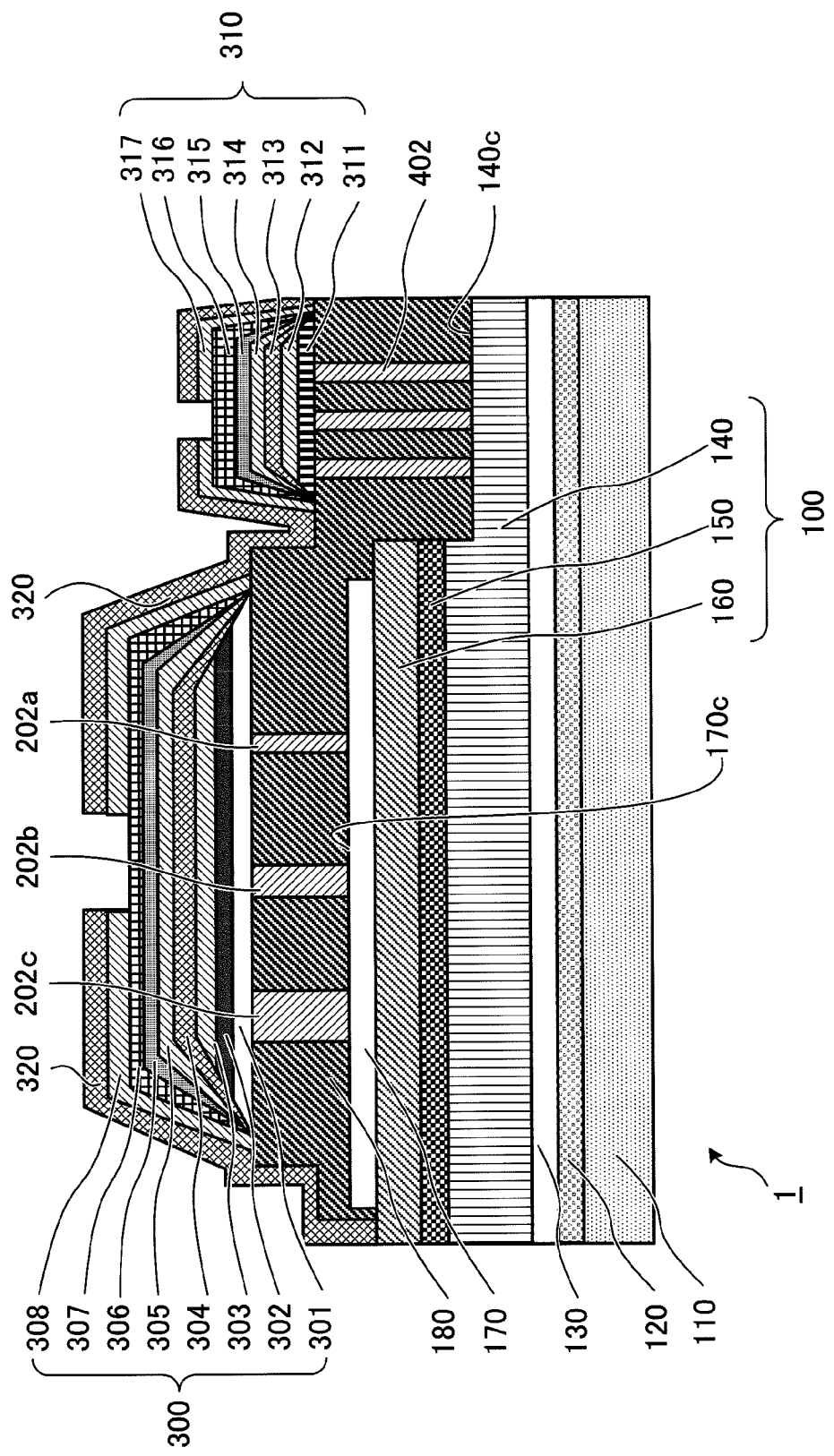
FIG. 6 is a cross-sectional view taken along VI-VI in FIG. 5.

In the FIGS. 5 and 6, a configuration is shown in which the longer the distance from a joint portion between the n-conductor portion 400 and the n-type semiconductor layer 140, the larger the cross-sectional area of the p-connective conductors 202 becomes. With this configuration, the exemplary embodiment is capable of remedying the light emission in the light emitting layer 150 that becomes higher in proximity of n-electrode 310. Hereinafter, more specific description will be given.

First, in the semiconductor light emitting element 1, the longer the distance between the p-connective conductors 202 and the joint portion of the n-conductor portion 400 and the n-type semiconductor layer 140, the higher the electrical resistance between the p-connective conductors 202 and the n-conductor portion 400 becomes. Accordingly, there is a possibility of provoking a phenomenon in which an excessive amount of electric current passes around the p-connective conductor 202a, where the electric current is more likely to pass through, namely, in proximity of the n-electrode 310. As a result, there is a possibility that a phenomenon occurs in which the light emission in the light emitting layer 150 becomes higher in proximity of the n-electrode 310.

Accordingly, in the exemplary embodiment, the distance of the p-connective conductors 202a, 202b and 202c from the joint portion of the n-conductor portion 400 and the n-type semiconductor layer 140 is longer in this order, and the area of the p-connective conductors 202a, 202b and 202c becomes larger in this order. Since, if the same components have the same lengths, the electrical resistance thereof becomes smaller as the cross-sectional area thereof becomes larger; and therefore, regarding each electrical resistance of the p-connective conductors 202 by itself, the electrical resistance of the p-connective conductors 202a, 202b and 202c becomes smaller in this order. This makes it possible to suppress the above-described phenomenon in which an excessive electric current passes in proximity of the n-electrode 310.

From above, the exemplary embodiment is capable of remedying the light emission in the light emitting layer 150 that becomes higher in proximity of the n-electrode 310, namely, so called inhomogeneity of light emission in the light emitting layer 150, mainly due to an excessive increase of the amount of electric current in proximity of the n-electrode 310.

It should be noted that there are some cases in which the n-conductor portion 400 is formed of plural n-connective conductors 402. In such a case, the distance between the p-connective conductor 202 and the joint portion of the n-conductor portion 400 and the n-type semiconductor layer 140 indicates the distance from the p-connective conductor 202 to a joint portion of the n-connective conductor 402 that is nearest to the p-connective conductor 202 and the n-type semiconductor layer 140.

Figure 7:
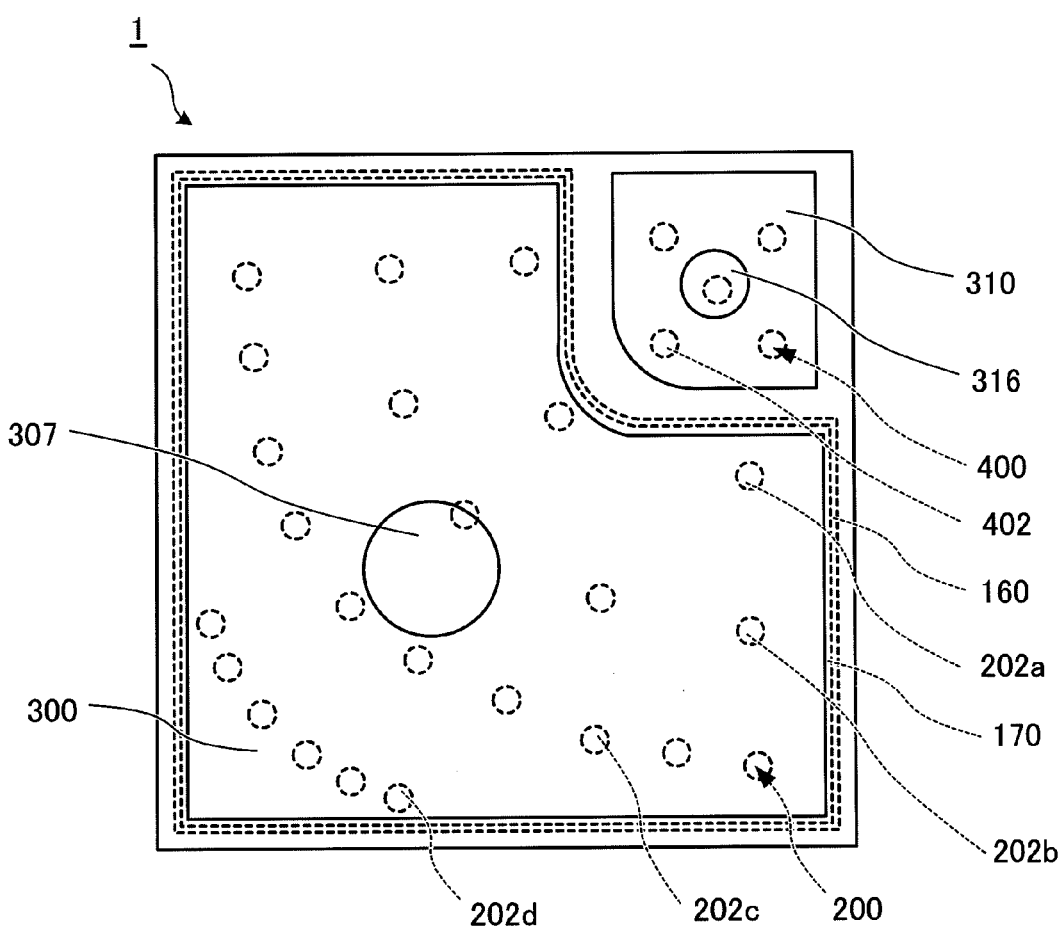
FIG. 7 is a schematic plan view of the semiconductor light emitting element according to still another exemplary embodiment.

In FIG. 7, another exemplary embodiment capable of remedying the the inhomogeneity of light emission is made.

In FIG. 7, a configuration is shown in which a distance between the nearest neighbors out of the plural p-connective conductors 202 becomes shorter as the distance from the joint portion of the n-conductor portion 400 and the n-type semiconductor layer 140 is increased.

In other words, the distance of the p-connective conductors 202a, 202b, 202c and 202d from the joint portion of the n-conductor portion 400 and the n-type semiconductor layer 140 becomes longer in this order. On the other hand, regarding the p-connective conductors 202, the distance between nearest neighbors becomes shorter in the order of the p-connective conductors 202a, 202b, 202c and 202d. As a result, it is possible to prevent excessive increase of the amount of electric current in proximity of the n-electrode 310, and thereby to prevent local light emission. That is, inhomogeneity of light emission can be remedied.

As observed above, change in the cross-sectional area of the p-connective conductors 202 (refer to FIGS. 5 and 6) and change in the distance between the p-connective conductors 202 (refer to FIG. 7) in response to the distance from the joint portion of the n-conductor portion 400 and the n-type semiconductor layer 140 were described. However, both of the cross-sectional area of the p-connective conductors 202 and the distance between the p-connective conductors 202 may be changed. In other words, the p-connective conductors 202 may have the configuration such that the longer the distance from the joint portion of the n-conductor portion 400 and the n-type semiconductor layer 140, the larger the cross-sectional area become and the shorter the distance between the p-connective conductors 202 become.

Further, there may be a configuration in which materials of the respective p-connective conductors 202 are different. In other words, the p-connective conductors 202 may have a configuration in which material thereof has electric resistance that is smaller as the distance from the joint portion of the n-conductor portion 400 and the n-type semiconductor layer 140 becomes longer.

Figure 8:
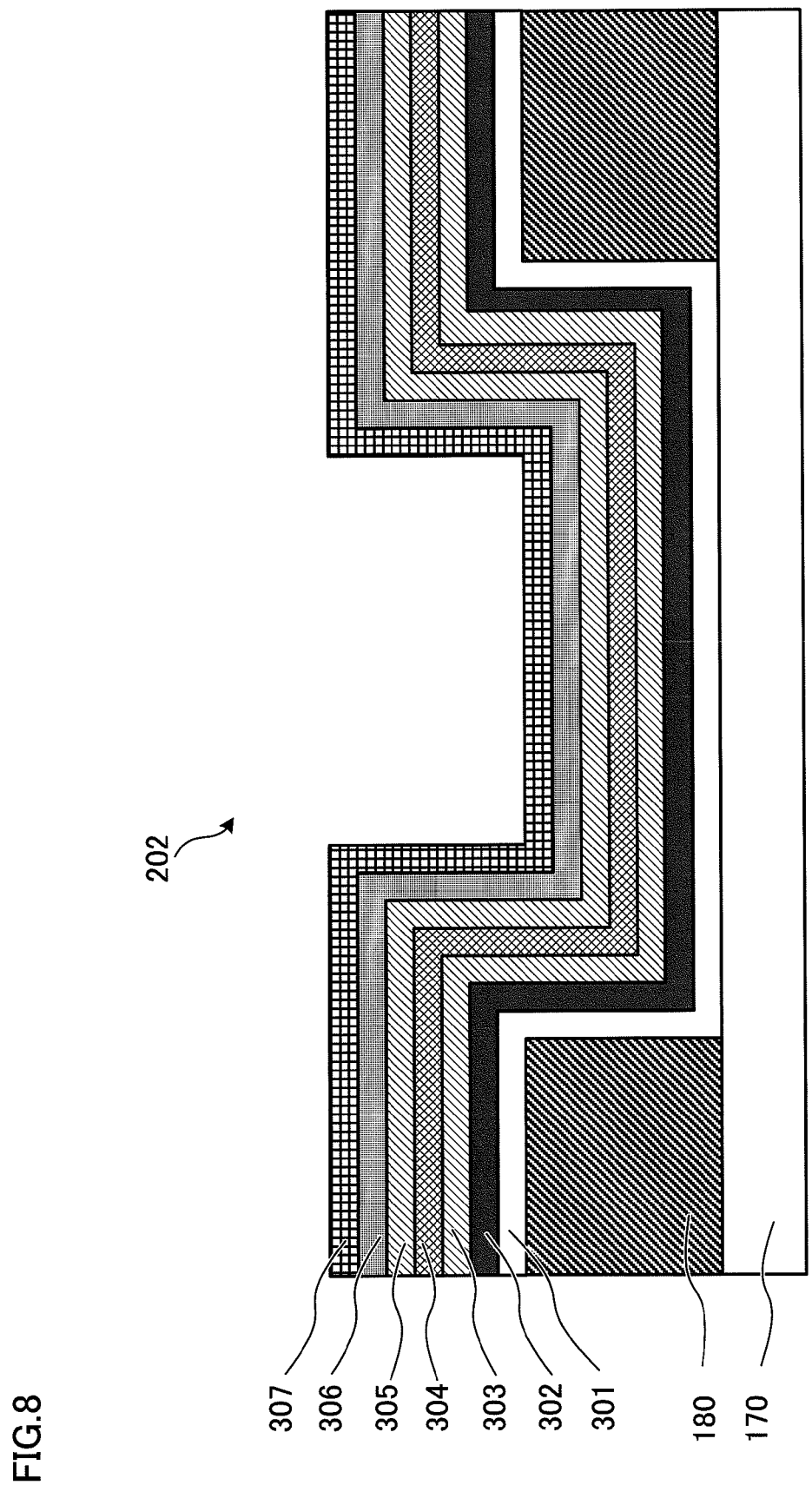
FIG. 8 is a schematic cross-sectional view of p-connective conductors as an example of a second conductor portion.
Figure 9:
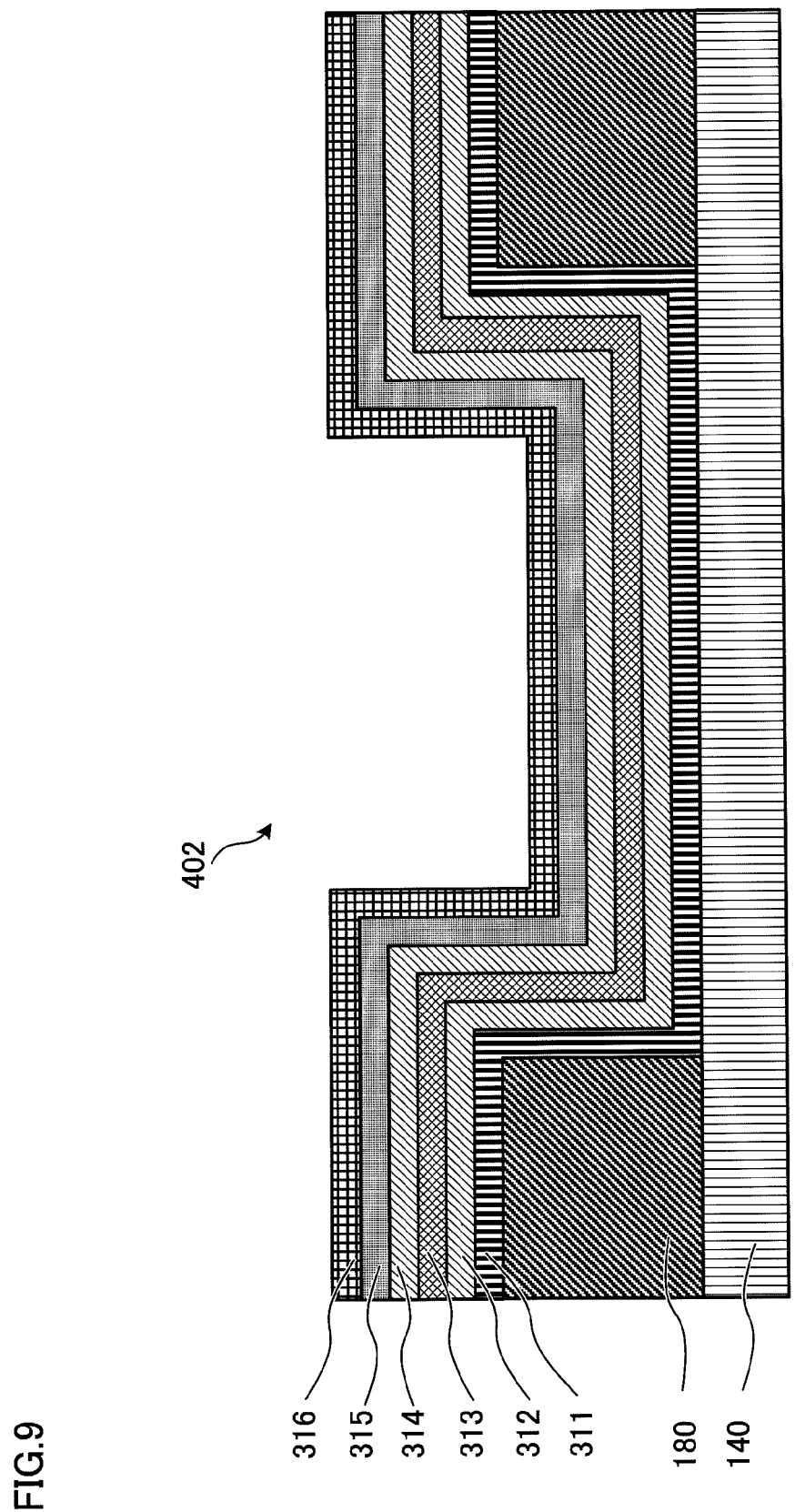
FIG. 9 is a schematic cross-sectional view of n-connective conductors as an example of a first conductor portion.

Next, a description will be given to a configuration in which the p-connective conductors 202 and the n-connective conductors 402 as shown in FIGS. 8 and 9 without applying metal plating on the wall surfaces of the through holes.

In other words, the configuration is such that the p-connective conductors 202 are formed by laminating each layer constituting the p-electrode 300 within the through holes, and the n-connective conductors 402 are formed by laminating each layer constituting the n-electrode 310 within the through holes.

First, in describing the p-connective conductors 202, as shown in FIG. 8, each layer of the first conductive layer 301, the second metal reflection layer 302, the first diffusion barrier layer 303, the second diffusion barrier layer 304, the third diffusion barrier layer 305, the fourth diffusion barrier layer 306 and the first bonding layer 307, each of which is the layer forming the p-electrode 300, is laminated on the through holes in this order to form the p-connective conductors 202.

It should be noted that, as shown in FIG. 8, by forming the p-electrode 300 and the p-connective conductors 202 with plural layers continuing in the surface direction, the light extraction efficiency is improved.

On the other hand, in describing the n-connective conductors 402, as shown in FIG. 9, each layer of the first metal reflection layer 311, the first diffusion barrier layer 312, the second diffusion barrier layer 313, the third diffusion barrier layer 314, the fourth diffusion barrier layer 315 and the first bonding layer 316, each of which is the layer forming the n-electrode 310, is laminated in this order to form the n-connective conductors 402.

It should be noted that, as shown in FIG. 9, by forming the n-electrode 310 and the n-connective conductors 402 with plural layers continuing in the surface direction, the light extraction efficiency is improved.

In the case where the p-connective conductors 202 are formed by laminating each layer constituting the p-electrode 300 within the through holes and the n-connective conductors 402 are formed by laminating each layer constituting the n-electrode 310 within the through holes as shown in FIGS. 8 and 9, for example, it can be considered that the following configuration of each layer is employed.

It should be noted that, in the following configuration, since each layer of the p-electrode 300 and the p-connective conductors 202 is identical, hereinafter, the p-electrode 300 and the p-connective conductors 202 will be collectively described. Due to the same reason, hereinafter, the n-electrode 310 and the n-connective conductors 402 will be collectively described.

<P-Connective Conductors>

The p-connective conductors 202 and the p-electrode 300 include: the first conductive layer 301; the second metal reflection layer 302 laminated on the first conductive layer 301; the first diffusion barrier layer 303, the second diffusion barrier layer 304, the third diffusion barrier layer 305 and the fourth diffusion barrier layer 306 that are laminated on the second metal reflection layer 302; and the first bonding layer 307.

<First Conductive Layer>

In the p-connective conductors 202, as shown in FIG. 8, the first conductive layer 301 is laminated on the transparent conductive layer 170. Accordingly, a material having good adhesive properties with the transparent conductive layer 170 is preferred.

On the other hand, if viewed as the entire p-electrode 300, the first conductive layer 301 is not directly laminated on the top surface 160c of the p-type semiconductor layer 160, part of which is removed by means of etching or the like for forming the n-electrode 310. However, as shown in FIG. 1, if viewed as a plan view, the first conductive layer 301 is formed in a position such that the first conductive layer 301 covers almost the entire surface of the top surface 160c of the p-type semiconductor layer 160 except for the edge portion thereof.

Then, since the first conductive layer 301 is laminated on the multilayer reflection film 180, it is preferable to use those having good adhesive properties with the multilayer reflection film 180. Further, in the semiconductor light emitting element 1, because the light from the light emitting layer 150 passed through the multilayer reflection film 180 is extracted from the substrate 110 side via the second metal reflection layer 302 and the like, the first conductive layer 301 having excellent optical transparency is preferably used. Still further, for uniformly diffusing an electric current over the entire surface of the p-type semiconductor layer 160, it is preferable to use the first conductive layer 301 having excellent conductivity and narrow resistance distribution.

From these points, a transparent conductive layer can be provided as an example of the first conductive layer 301. For example, in the exemplary embodiment, oxide conductive materials having good optical transparency to the light of wavelength emitted from the light emitting layer 150 is employed. In particular, part of oxides containing In is preferable in the point that both optical transparency and conductivity are excellent compared to other transparent conductive films. As an oxide conductive material containing In, for example, IZO (indium zinc oxide ($In_2O_3$—ZnO)) can be provided. However, IZO constituting the first conductive layer 301 is not subjected to thermal treatment and is left to be in an amorphous state.

For the reason described above, the thickness of the first conductive layer 301 is preferably in the range of 1 nm to 50 nm. In the case where the thickness is less than 1 nm, there is a possibility that the adhesive properties with the transparent conductive layer 170 are deteriorated and thereby the contact resistance is increased. In the case where the thickness is more than 50 nm, the optical transparency is reduced, and a series resistance is increased to result in the increase of the forward voltage Vf of the light emitting element.

<Metal Reflection Layer>

On the first conductive layer 301, the second metal reflection layer 302 is laminated.

In the p-electrode 300, in a plan view as shown in FIG. 1, the second metal reflection layer 302 is formed to cover the entire first conductive layer 301. In a cross-sectional view as shown in FIG. 2, the center portion of the second metal reflection layer 302 is formed to have a constant thickness and be substantially flat. On the other hand, end portion sides of the second metal reflection layer 302 are formed to be inclined to the top surface 180c on the p-electrode side of the multilayer reflection film 180 due to gradual reduction of the thickness thereof.

Moreover, the second metal reflection layer 302 is formed on the first conductive layer 301, but not formed on the multilayer reflection film 180. In other words, the multilayer reflection film 180 and the second metal reflection layer 302 are configured not to directly contact each other. Further, as will be described later, the second metal reflection layer 302 also has a function to supply electricity to the p-type semiconductor layer 160 via the first conductive layer 301 or the like. Accordingly, the resistance thereof is low, and it is required to suppress the contact resistance thereof with the first conductive layer to be low.

The second metal reflection layer 302 in the exemplary embodiment is configured with a metal such as Al (aluminum), Ag (silver), Ni (nickel) and Cr (chrome) or an alloy containing at least one of them. In particular, it is preferable to use silver as the second metal reflection layer 302 because of high optical reflection properties to the light of wavelength in the region of blue to green emitted from the light emitting layer 150.

Here, as a material of the first conductive layer 301 in the case where silver is used as the second metal reflection layer 302, use of a transparent conductive material such as IZO, which has good adhesive properties with the transparent conductive layer 170 exposed to air, is preferred.

The thickness of the second metal reflection layer 302 is preferably in the range of 80 nm to 200 nm. In the case where the thickness is less than 80 nm, a reflection coefficient by the second metal reflection layer 302 is reduced. In the case where the thickness is more than 200 nm, production costs of the light emitting element are increased, and it is unfavorable.

<Diffusion Barrier Layer>

As shown in FIG. 2, on the second metal reflection layer 302, the first diffusion barrier layer 303 is laminated. The second diffusion barrier layer 304, the third diffusion barrier layer 305 and the fourth diffusion barrier layer 306 are laminated on the first diffusion barrier layer 303, the second diffusion barrier layer 304 and the third diffusion barrier layer 305, respectively.

The first diffusion barrier layer 303, the second diffusion barrier layer 304 and the third diffusion barrier layer 305 suppress diffusion of a metal (in this specific example, Ag (silver)) constituting the second metal reflection layer 302 in a contact state and a metal (in this specific example, Pt (platinum)) constituting the fourth diffusion barrier layer 306.

Moreover, the fourth diffusion barrier layer 306 suppresses diffusion of a metal (in this specific example, Ta (tantalum)) constituting the third diffusion barrier layer 305 in a contact state and a metal (in this specific example, Au (gold)) constituting the first bonding layer 307.

In the p-electrode 300, in a plan view as shown in FIG. 1, the first diffusion barrier layer 303, the second diffusion barrier layer 304, the third diffusion barrier layer 305 and the fourth diffusion barrier layer 306 are formed to cover the entire second metal reflection layer 302. In a cross-sectional view as shown in FIG. 2, the center portion of each of the diffusion barrier layers is formed to have a constant thickness and be substantially flat. On the other hand, end portion sides of each of the diffusion barrier layers are formed to be inclined to the top surface 180c on the p-electrode side of the multilayer reflection film 180 due to gradual reduction of the thickness thereof. Moreover, each of the diffusion barrier layers is formed on the second metal reflection layer 302, but not formed on the multilayer reflection film 180. In other words, the multilayer reflection film 180 and each of the diffusion barrier layers 303 to 306 are configured not to directly contact each other.

It is preferable to use each of the diffusion barrier layers 303 to 306 capable of making an ohmic contact with a layer to contact, and has a small contact resistance with the layer to contact. However, each of the diffusion barrier layers 303 to 306 is basically not required to have a function to pass through the light from the light emitting layer 150, and therefore, different from the above-described first conductive layer 301, there is no need to have optical transparency. Further, since each of the diffusion barrier layers 303 to 306 also has a function to supply electricity to the p-type semiconductor layer 160 via the second metal reflection layer 302 and the first conductive layer 301 or the like, it is preferable to use those having excellent conductivity and narrow resistance distribution.

In the exemplary embodiment, Ta (tantalum) is used as the first diffusion barrier layer 303, TaN (tantalum nitride) is used as the second diffusion barrier layer 304, Ta (tantalum) is used as the third diffusion barrier layer 305 and Pt (platinum) is used as the fourth diffusion barrier layer 306.

The thickness of the first diffusion barrier layer 303 is preferably in the range of 20 nm to 200 nm. In the case where the thickness is less than 20 nm, barrier properties for suppressing diffusion in the second metal reflection layer 302 (in this specific example, Ag (silver)) and the fourth diffusion barrier layer 306 (in this specific example, Pt (platinum)) become insufficient, and in this specific example, there is a possibility that Ag and Pt react with each other. In addition, in the case where the thickness is more than 200 nm, production costs of the light emitting element are increased.

The thickness of the second diffusion barrier layer 304 is preferably in the range of 1 nm to 50 nm. In the case where the thickness is less than 1 nm, adhesive properties with the diffusion barrier layer on both sides thereof are deteriorated. Further, in the case where the thickness is more than 50 nm, a series resistance is increased to result in the increase of the forward voltage Vf of the light emitting element.

The thickness of the third diffusion barrier layer 305 is preferably in the range of 20 nm to 200 nm. In the case where the thickness is less than 20 nm, adhesive properties with the second diffusion barrier layer 304 and the fourth diffusion barrier layer 306 are deteriorated. Further, barrier properties for suppressing diffusion in the second metal reflection layer 304 (in this specific example, Ag (silver)) and the fourth diffusion barrier layer 306 (in this specific example, Pt (platinum)) become insufficient, and in this specific example, there is a possibility that Ag and Pt react with each other. Moreover, in the case where the thickness is more than 200 nm, production costs of the light emitting element are increased.

The thickness of the fourth diffusion barrier layer 306 is preferably in the range of 50 nm to 200 nm. In the case where the thickness is less than 50 nm, there is a possibility that the third diffusion barrier layer 305 (for example, Ta) and the first bonding layer 307 (for example, Au) react with each other. Further, in the case where the thickness is more than 200 nm, production costs are increased; and therefore it is not good.

<First Bonding Layer>

On the top surface of the fourth diffusion barrier layer 306, the first bonding layer 307 is laminated to cover the fourth diffusion barrier layer 306.

In the p-electrode 300, in a plan view as shown in FIG. 1, the first bonding layer 307 is formed to cover the entire fourth diffusion barrier layer 306. The center portion of the first bonding layer 307 is formed to have a constant thickness and be substantially flat, and meanwhile, end portion sides of the first bonding layer 307 are formed to be inclined to the top surface 180c on the p-electrode side of the multilayer reflection film 180 due to gradual reduction of the thickness thereof.

For example, the first bonding layer 307 includes at least one or more metal layers at an innermost portion, that is, so as to contact the fourth diffusion barrier layer 306 or the like. In addition, as a metal layer thereof that is a surface layer at an outermost portion, generally, Au (gold) is used. In the exemplary embodiment, a single layer film of Au (gold) is used as the first bonding layer 307.

The thickness of the first bonding layer 307 is preferably in the range of 100 nm to 2 μm. In the case where the thickness is less than 100 nm, a resistance as the first bonding layer 307 becomes higher. Further, in the case where the thickness is more than 2 μm, production costs of the light emitting element are increased.

<First Adhesive Layer>

On the top surface and side surface of the first bonding layer 307, the first adhesive layer 308 is laminated to cover the first bonding layer 307 except for a part thereof.

In the p-electrode 300, in a plan view, the first adhesive layer 308 is formed to cover the first bonding layer 307 except for an exposed portion thereof. The center portion of the first adhesive layer 308 is formed to have a constant thickness and be substantially flat. On the other hand, end portion sides of the first adhesive layer 308 are formed to be inclined to the top surface 180c on the p-electrode side of the multilayer reflection film 180 due to gradual reduction of the thickness thereof. The end portion on a side surface side of the first adhesive layer 308 is provided to contact the top surface 180c on the p-electrode side of the multilayer reflection film 180.

The first adhesive layer 308 is provided to improve physical adhesive properties between the first bonding layer 307 configured with Au (gold) and the passivation layer 320. In the exemplary embodiment, the first adhesive layer 308 is formed of Ta (tantalum).

The thickness of the first adhesive layer 308 is preferably in the range of 5 nm to 20 nm. In the case where the thickness is less than 5 nm, adhesive properties between the first bonding layer 307 and the passivation layer 320 are deteriorated. Further, in the case where the thickness is more than 20 nm, an operation time in the etching process becomes longer to result in the increase of production costs of the light emitting element.

<First Electrode>

Next, the configuration of the n-electrode 310 will be described.

The n-electrode 310 includes: the first metal reflection layer 311, the first diffusion barrier layer 312, the second diffusion barrier layer 313, the third diffusion barrier layer 314 and the fourth diffusion barrier layer 315 that are laminated on the first metal reflection layer 311; the first bonding layer 316; and the first adhesive layer 317 laminated on the first bonding layer 316 except for the above-described exposed portion of the first bonding layer 316.

<Metal Reflection Layer>

In the n-connective conductors 402, the first metal reflection layer 311 is laminated on the n-type semiconductor layer 140 as shown in FIG. 9. Accordingly, a material having good adhesive properties with the n-type semiconductor layer 140 is preferred.

On the other hand, if viewed as the entire n-electrode 310, the first metal reflection layer 311 is formed to cover almost the entire region of the top surface 140c of the n-type semiconductor layer 140 as shown in FIG. 2. The center portion of the first metal reflection layer 311 is formed to have a constant thickness and be substantially flat. On the other hand, end portion sides of the first metal reflection layer 311 are formed to be inclined to the top surface 180d on the n-electrode side of the multilayer reflection film 180 due to gradual reduction of the thickness thereof. Then, since the first metal reflection layer 311 is laminated on the multilayer reflection film 180, it is preferable to use the material having good adhesive properties with the multilayer reflection film 180.

The first metal reflection layer 311 in the exemplary embodiment is configured with a metal such as Al (aluminum), Ag (silver) and Ni (nickel) or an alloy containing at least one of them. It should be noted that, as will be described later, the first metal reflection layer 311 also has a function to supply electricity to the n-type semiconductor layer 140; therefore, it is preferable to have a low resistance.

The thickness of the first metal reflection layer 311 is preferably in the range of 80 nm to 200 nm. In the case where the thickness is less than 80 nm, a reflection coefficient as the reflection layer is reduced. Further, in the case where the thickness is more than 200 nm, production costs of the light emitting element are increased.

<Diffusion Barrier Layer or the Like>

In the exemplary embodiment, since configurations of each of the diffusion barrier layers 312 to 315, the first bonding layer 316 and the first adhesive layer 317 in the n-electrode 310 are same as the configurations of each of the diffusion barrier layers 303 to 306, the first bonding layer 307 and the first adhesive layer 308 in the p-electrode 300, descriptions in the above-described p-electrode 300 are referred to as descriptions regarding respective configurations.

It should be noted that, in the above exemplary embodiment, it has been described that the p-connective conductors 202 and the n-connective conductors 402 are provided by forming the through holes; however, an interpretation for limiting thereto should not be given. For example, cylindrical p-connective conductors 202 and n-connective conductors 402 may be formed before laminating the multilayer reflection film 180, or the p-connective conductors 202 and the n-connective conductors 402 may be formed by embedding a metal member such as cupper after laminating the multilayer reflection film 180.

Moreover, the p-connective conductors 202 and the n-connective conductors 402 may have the same configuration except for the first conductive layer 301, the second metal reflection layer 302 and the first metal reflection layer 311, or may have different configurations. Further, the shape of the p-connective conductors 202 and the n-connective conductors 402 is not limited to the cylindrical shape, but may be a polygonal column including triangle.

Figure 10A:
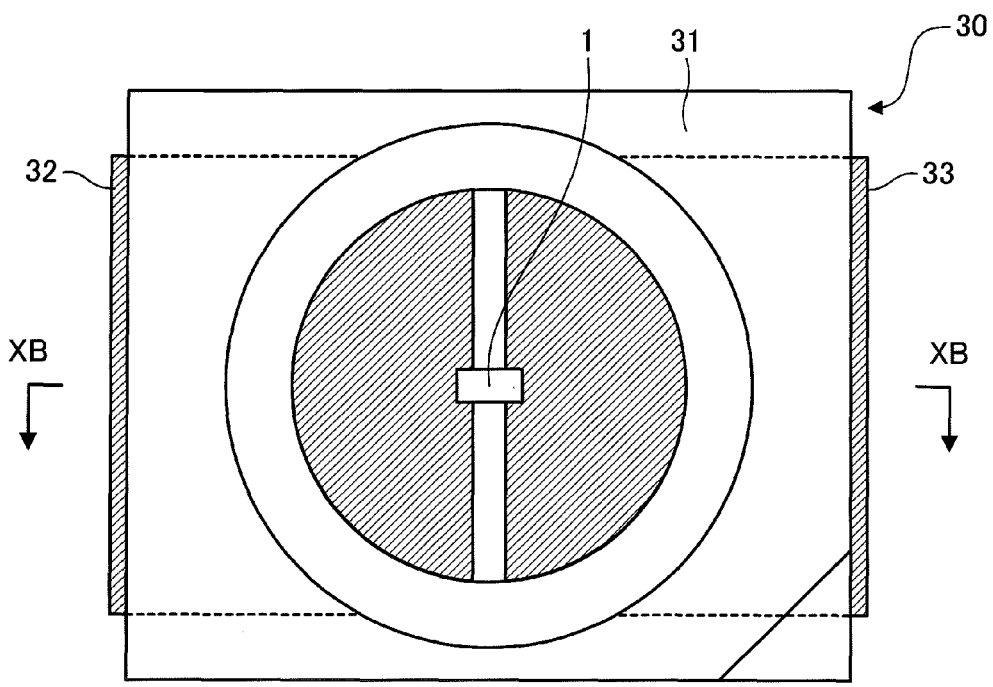
FIGS. 10A and 10B are diagrams illustrating an example of a light emitting device (lamp) equipped with the semiconductor light emitting element shown in FIG. 1.
Figure 10B:
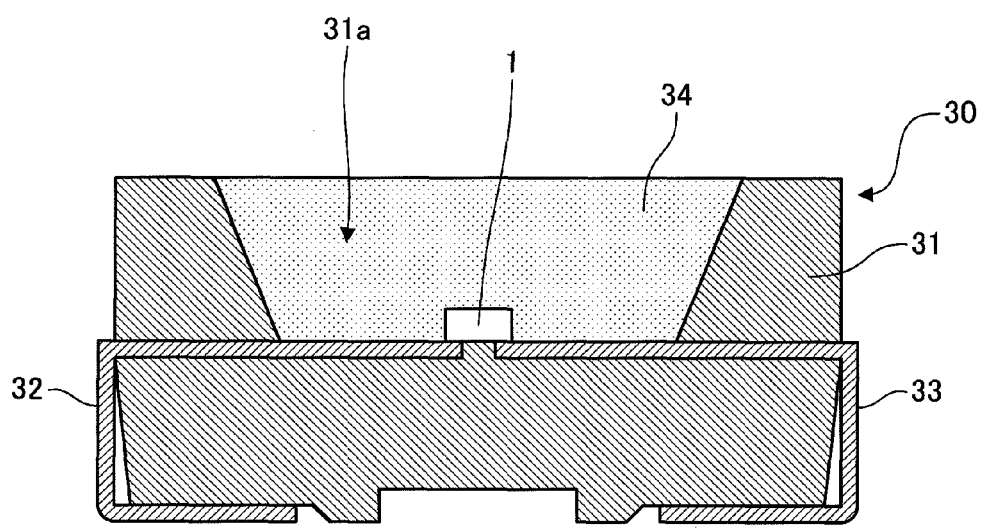

FIGS. 10A and 10B are diagrams illustrating an example of the light emitting device 30 (also called as a light emitting chip 30 or a lamp 30) equipped with the semiconductor light emitting element shown in FIG. 1. Here, FIG. 10A shows a top view of the light emitting chip 30, and FIG. 10B shows a cross-sectional view taken along XB-XB in FIG. 10A.

The light emitting chip 30 includes: a housing 31 on one side of which a concave portion 31a is formed; a first lead portion 32 and a second lead portion 33 composed of lead frames formed in the housing 31; the semiconductor light emitting element 1 attached to a bottom surface of the concave portion 31a; and a sealing portion 34 provided to cover the concave portion 31a. It should be noted that an illustration of the sealing portion 34 is omitted in FIG. 10A.

The housing 31 as an example of a base portion is formed by injection molding of a white thermoplastic resin on a metal lead portion including the first lead portion 32 and the second lead portion 33.

The first lead portion 32 and the second lead portion 33 are metal plates having a thickness of the order of 0.1 mm to 0.5 mm, and configured by laminating several μm of nickel, titanium, gold or silver as a plating layer on an alloy of iron and copper, for example, which is a metal having excellent workability and thermal conductivity, as a base. In the exemplary embodiment, part of each of the first lead portion 32 and the second lead portion 33 is exposed at the bottom surface of the concave portion 31a. Further, one end portion of each of the first lead portion 32 and the second lead portion 33 is exposed to outside of the housing 31 and is bent from an outer wall surface toward a back surface side of the housing 31. It should be noted that, in the exemplary embodiment, the first lead portion 32 functions as a first wiring and the second lead portion 33 functions as a second wiring.

Moreover, the semiconductor light emitting element 1 is attached to the concave portion 31a over the first lead portion 32 and the second lead portion 33.

The sealing portion 34 is configured with a transparent resin having high optical transparency in a visible region wavelength and high refractive index. As the resin constituting the sealing portion 34, which satisfies the properties of high heat resistance, high weather resistance and high mechanical strength, for example, an epoxy resin or a silicone resin can be used. In the exemplary embodiment, the transparent resin constituting the sealing portion 34 contains a phosphor that converts a part of the light emitted from the semiconductor light emitting element 1 into green light and red light. It should be noted that, instead of such a phosphor, a phosphor that converts a part of blue light into yellow light or a phosphor that converts a part of blue light into yellow light and red light may be contained.

In the exemplary embodiment, in the state where the semiconductor light emitting element 1 shown in FIG. 1 is vertically reversed with respect to the concave portion 31a of the light emitting chip 30, the first lead portion 32 as an example of a positive electrode and the second lead portion 33 as an example of a negative electrode are electrically connected to the p-electrode 300 (the first bonding layer 307) and the n-electrode 310 (the first bonding layer 316) by use of solder, respectively, and are mechanically secured. Such a connecting method of the semiconductor light emitting element 1 is referred to as flip-chip bonding in general.

It should be noted that an electronic appliance, such as a backlight, a mobile cellular telephone, a display, various kinds of panels and the like, a computer, a game machine and illumination incorporating the light emitting chip 30 according to the exemplary embodiment, and a mechanical device incorporating those electronic appliances, such as an automobile, is equipped with the semiconductor light emitting element 1 having excellent light emitting properties. Especially, in the electronic appliance, such as the backlight, the mobile cellular telephone, the display, the game machine and the illumination, that is battery operated, an excellent product equipped with the semiconductor light emitting element 1 having excellent light emitting properties can be provided; and therefore, it is favorable. In addition, the configuration of the light emitting chip 30 including the semiconductor light emitting element 1 is not limited to that shown in FIGS. 10A and 10B, and a package configuration called, for example, a shell type may be employed.

EXAMPLES

Hereinafter, the present invention will provide specific description based on Examples regarding the semiconductor element including the light emitting layer; however, the present invention is not limited to these Examples.

Example 1

The group III nitride semiconductor light emitting element including a light emitting element portion equipped with a gallium nitride-based compound semiconductor was prepared as follows.

As shown in FIGS. 1 and 2, on a substrate of a C-plane sapphire single crystal, via the intermediate layer 120 composed of AlN, the base layer 130 composed of undoped GaN with a thickness of 4 µm, the n-contact layer composed of Si-doped (concentration of $1 \times 10^{19}/cm^3$) GaN with a thickness of 3 µm, the n-cladding layer composed of Si-doped (concentration of $1 \times 10^{18}/cm^3$) $In_{0.1}Ga_{0.9}N$ with a thickness of 13 nm (the n-type semiconductor layer 140 is configured with the n-contact layer and the n-cladding layer), the light emitting layer 150 having a multiple quantum well structure in which the barrier layer composed of GaN with a thickness of 16 nm and the well layer composed of $In_{0.2}Ga_{0.8}N$ with a thickness of 2.5 nm alternately laminated six times and finally the barrier layer is provided, the p-cladding layer composed of Mg-doped (concentration of $1 \times 10^{20}/cm^3$) $Al_{0.07}Ga_{0.93}N$ with a thickness of 3 nm and the p-contact layer composed of Mg-doped (concentration of $8 \times 10^{19}/cm^3$) GaN with a thickness of 0.18 µm (the p-type semiconductor layer 160 is configured with the p-contact layer and the p-cladding layer) were laminated in this order, thereby the laminated semiconductor layer (the epitaxial layer) 100 composed of the group III nitride semiconductor with a thickness of 9 µm was formed.

Next, on a predetermined position of the p-contact layer of the laminated semiconductor layer (epitaxial layer) 100, the transparent conductive layer 170 composed of IZO was formed by use of a known photolithographic technology and lift-off technology.

Further, the top surface 140c of the n-contact layer on the area where the n-electrode 310 was to be formed was exposed in a quarter circular state by use of a known photolithographic technology and reactive ion etching technology.

Subsequently, as shown in FIG. 3, the multilayer reflection film 180 was formed. In the multilayer reflection film 180, $SiO_2$ with a thickness of 67 nm was used as the low refractive index layer (the first refractive index layer) 180a and $TiO_2$ with a thickness of 37 nm was used as the high refractive index layer (the second refractive index layer) 180b, and five high refractive index layers 180b were sandwiched between six low refractive index layers 180a to provide eleven layers of laminated layer configuration in total.

Next, by use of a known photolithographic technology and etching technology, plural through holes were formed in the multilayer reflection film 180 in the area for providing the p-electrode 300 and the n-electrode 310 as shown in FIG. 2. It should be noted that the diameter of the through hole was 10 µm. Subsequently, by use of a known photolithographic technology, in the respective areas where the p-electrode 300 and the n-electrode 310 were provided, the IZO films (with a thickness of 10 nm) as under layers for the p-conductor portion 200 and the first conductive layer 301 (with a thickness of 10 nm) and for the n-conductor portion 400 and the first metal reflection layer 311 (laminated structure of IZO/Ag) as shown in FIG. 1 were simultaneously formed by using IZO.

Similarly, for common electrode materials constituting the p-electrode 300 and the n-electrode 310, a simultaneous film forming method was employed.

In other words, an over layer of the first metal reflection layer 311 and the second metal reflection layer 302 were formed of Ag with a thickness of 100 nm, the first diffusion barrier layers 303 and 312 were formed of Ta with a thickness of 40 nm, the second diffusion barrier layers 304 and 313 were formed of TaN with a thickness of 20 nm, the third diffusion barrier layers 305 and 314 were formed of Ti with a thickness of 100 nm, the fourth diffusion barrier layers 306 and 315 were formed of Pt with a thickness of 100 nm, the first bonding layers 307 and 316 were formed of Au with a thickness of 500 nm, and the first adhesive layers 308 and 317 were formed of Ta with a thickness of 10 nm in order, and thereby the p-electrode 300 and the n-electrode 310 having, for example, IZO/Ag/Ta/TaN/Ti/Pt/Au/Ta structures were formed.

Next, the passivation layer 320 composed of $SiO_2$ was formed and then etching was applied by use of a known photolithographic technology and reactive ion etching technology to expose a part of the first bonding layers 307 and 316 in a circular shape having the diameter of 90 µm.

Next, after UBM film was formed on the entire wafer by a known sputtering method, a resist was formed on the first bonding layer 307 and 316 except for the exposed portion, Au was grown on the exposed portion to the thickness of 13 µm by a known electrolytic plating method, and thereafter, AuSn with a thickness of 2 µm was formed by an evaporation method. Subsequently, the resist and UBM film around the bump electrode were removed to form the first bump electrode 21 and the second bump electrode 20 as shown in FIG. 4. Next, polishing and dividing of the sapphire substrate was performed and a light emitting element of 350 µm×350 µm was obtained.

Finally, the light emitting element was reversed and placed on the wiring board 10 using the AlN substrate, alignment between the semiconductor light emitting element and the wiring board 10 was performed so that the anode 11 and the cathode 12 on the wiring board 10 corresponded to the second bump electrode 20 and the first bump electrode 21 of the semiconductor light emitting element, respectively, and thereafter, the semiconductor light emitting element was pressed (press-fitted) onto the wiring board 10 while heating to 300° C. to electrically connect the anode 11 and the cathode 12 with the second bump electrode 20 and the first bump electrode 21, respectively.

The wiring board 10, onto which the semiconductor light emitting element was mounted, was placed on TO 18 and was connected by wires.

The LED characteristics of the light emitting element obtained in Example 1 were such that the light emission wavelength λ was 452 nm and the light emission output Po was 28.3 mW and the light emission efficiency η was 45.1% when the forward voltage Vf was 3.14V (electric current IF was 20 mA).

Example 2

The semiconductor light emitting element was produced in the same manner as Example 1 except that the first bump electrode 21 and the second bump electrode 20 were not formed, and solder balls were attached as connectors with the AlN submount to connect the light emitting element. The LED characteristics of the light emitting element obtained in Example 2 were described in Table 1.

Example 3

The semiconductor light emitting element was produced in the same manner as Example 1 except that the pattern of the p-connective conductors 202 was formed as the predetermined pattern shown in FIG. 5. The LED characteristics of the light emitting element obtained in Example 3 were described in Table 1. It should be noted that, in the p-connective conductors 202, three kinds of through holes having different diameters (diameters of 10 μm, 30 μm and 50 μm) were formed, and in the n-connective conductors 402, the through holes having the diameter of 10 μm were formed.

Example 4

The semiconductor light emitting element was produced in the same manner as Example 1 except that the pattern of the p-connective conductors 202 was formed as the predetermined pattern shown in FIG. 7. The LED characteristics of the light emitting element obtained in Example 4 were described in Table 1. It should be noted that, in the p-connective conductors 202 and the n-connective conductors 402, the through holes having the diameter of 10 μm were formed.

Comparative Example

The semiconductor light emitting element was produced in the same manner as Example 1 except that the multilayer reflection film 180, the p-conductor portion 200 and the n-conductor portion 400 were not formed. The LED characteristics of the light emitting element obtained in Comparative example were described in Table 1.

As learned from Table 1, compared to Comparative example, the driving voltage Vf in the forward direction is substantially the same level, but light emission output Po is high in Examples 1 to 4. In this way, the semiconductor light emitting element according to the present invention is able to provide a light emitting element which is significantly improved in the point of light extraction efficiency.

TABLE 1

| | | | Evaluation IF = 20 mA | | |
|---|---|---|---|---|---|
| | Presence or absence of bump electrode | Pattern of p-connective conductors | Forward Voltage Vf (V) | Light emission wavelength λ (nm) | Light emission output Po (mW) | Light emission efficiency η (%) |
| Example 1 | Present | FIG. 1 | 3.14 | 452 | 28.3 | 45.1 |
| Example 2 | Absent | FIG. 1 | 3.16 | 453 | 28.1 | 44.5 |
| Example 3 | Present | FIG. 5 | 3.15 | 452 | 28.7 | 45.6 |
| Example 4 | Present | FIG. 7 | 3.14 | 452 | 28.6 | 45.5 |
| Comparative example | Absent | FIG. 1 | 3.12 | 451 | 24.1 | 38.6 |

REFERENCE SIGNS LIST

1 . . . Semiconductor light emitting element
20 . . . Second bump electrode
21 . . . First bump electrode
100 . . . Laminated semiconductor layer
110 . . . Substrate
120 . . . Intermediate layer
130 . . . Base layer
140 . . . N-type semiconductor layer
140c . . . Top surface
150 . . . Light emitting layer
160 . . . P-type semiconductor layer
170 . . . Transparent conductive layer
170c . . . Top surface
180 . . . Multilayer reflection film
180a . . . Low refractive index layer
180b . . . High refractive index layer
180c . . . Top surface on p-electrode side
180d . . . Top surface on n-electrode side
200 . . . P-conductor portion
202 . . . P-connective conductors
300 . . . P-electrode
310 . . . N-electrode
400 . . . N-conductor portion
402 . . . N-connective conductors

The invention claimed is:

1. A semiconductor light emitting element comprising:
a first semiconductor layer composed of a group III nitride semiconductor having a first conduction type;
a light emitting layer that is laminated on one surface of the first semiconductor layer so as to expose a part of the one surface and emits light by current flow;
a second semiconductor layer composed of a group III nitride semiconductor having a second conduction type, which is different from the first conduction type, and laminated on the light emitting layer;
a first multilayer reflection film configured by alternately laminating first refractive index layers each having a first refractive index and transparency to light emitted from the light emitting layer and second refractive index layers each having a second refractive index, which is higher than the first refractive index, and transparency to light emitted from the light emitting layer, the first multilayer reflection film being laminated on the part of the one surface of the first semiconductor layer that has been exposed;
a first conductor portion that is formed to penetrate the first multilayer reflection film, and one end thereof is connected to the exposed part of the first semiconductor layer;
a first electrode which is laminated on the first multilayer reflection film, and to which the other end of the first conductor portion is connected;
a transparent conductive layer that is composed of a metal oxide having transparency to light emitted from the light emitting layer and conductivity, and is laminated on the second semiconductor layer;
a second multilayer reflection film configured by alternately laminating first refractive index layers each having a first refractive index and transparency to light emitted from the light emitting layer and second refractive index layers each having a second refractive index, which is higher than the first refractive index, and transparency to light emitted from the light emitting layer, the second multilayer reflection film being laminated on the transparent conductive layer;

a second conductor portion that is formed to penetrate the second multilayer reflection film, and one end thereof is connected to the transparent conductive layer;

a second electrode which is laminated on the second multilayer reflection film, and to which the other end of the second conductor portion is connected;

a first opening portion and a second opening portion that are formed on surfaces of the first electrode and the second electrode of a laminated semiconductor layer and used for electrical connection with outside; and a first bump electrode and a second bump electrode that are provided to the first opening portion and the second opening portion for electrical connection with outside.

2. The semiconductor light emitting element according to claim 1, wherein the second conductor portion has a plurality of connective conductors, one end of each of which is connected to the transparent conductive layer and the other end of each of which is connected to the second electrode.

3. The semiconductor light emitting element according to claim 2, wherein the plurality of connective conductors constituting the second conductor portion is formed so that a distance between the nearest neighbors out of the plurality of the connective conductors becomes shorter as a distance from a joint portion of the first conductor portion and the first semiconductor layer becomes longer.

4. The semiconductor light emitting element according to claim 2, wherein the plurality of connective conductors constituting the second conductor portion is formed so that a cross-sectional area thereof is increased as a distance from a joint portion of the first conductor portion and the first semiconductor layer becomes longer.

5. The semiconductor light emitting element according to claim 1, wherein the first electrode includes a first reflection layer having a reflecting property to light emitted from the light emitting layer and the second electrode includes a second reflection layer having a reflecting property to light emitted from the light emitting layer.

6. The semiconductor light emitting element according to claim 1, wherein the second conductor portion and the second electrode are formed with a plurality of layers continuing in a surface direction.

7. The semiconductor light emitting element according to claim 1, wherein the first multilayer reflection film and the second multilayer reflection film are configured as one piece continuing in a surface direction.

8. The semiconductor light emitting element according to claim 1, wherein each of the first bump electrode and the second bump electrode includes a connective electrode containing Sn for connecting to outside on a tip end portion thereof.

9. An electronic apparatus comprising the semiconductor light emitting element according claim 1.

10. A light emitting device comprising:
a base portion on which a first wiring and a second wiring are formed; and
a semiconductor light emitting element mounted on the base portion by flip-chip bonding,
wherein the semiconductor light emitting element comprises:
a first semiconductor layer composed of a group III nitride semiconductor having a first conduction type;
a light emitting layer that is laminated on one surface of the first semiconductor layer so as to expose a part of the one surface and emits light by current flow;
a second semiconductor layer composed of a group III nitride semiconductor having a second conduction type, which is different from the first conduction type, and laminated on the light emitting layer;
a first multilayer reflection film configured by alternately laminating first refractive index layers each having a first refractive index and transparency to light emitted from the light emitting layer and second refractive index layers each having a second refractive index, which is higher than the first refractive index, and transparency to light emitted from the light emitting layer, the first multilayer reflection film being laminated on the part of the one surface of the first semiconductor layer that has been exposed;
a first conductor portion that is formed to penetrate the first multilayer reflection film, and one end thereof is connected to the exposed part of the first semiconductor layer;
a first electrode which is laminated on the first multilayer reflection film, and to which the other end of the first conductor portion is connected;
a transparent conductive layer that is composed of a metal oxide having transparency to light emitted from the light emitting layer and conductivity, and is laminated on the second semiconductor layer;
a second multilayer reflection film configured by alternately laminating first refractive index layers each having a first refractive index and transparency to light emitted from the light emitting layer and second refractive index layers each having a second refractive index, which is higher than the first refractive index, and transparency to light emitted from the light emitting layer, the second multilayer reflection film being laminated on the transparent conductive layer;
a second conductor portion that is formed to penetrate the second multilayer reflection film, and one end thereof is connected to the transparent conductive layer;
a second electrode which is laminated on the second multilayer reflection film, and to which the other end of the second conductor portion is connected;
a first opening portion and a second opening portion that are formed on surfaces of the first electrode and the second electrode of a laminated semiconductor layer and used for electrical connection with outside; and
a first bump electrode and a second bump electrode that are provided to the first opening portion and the second opening portion for electrical connection with outside.

* * * * *